(12) United States Patent
Alcott et al.

(10) Patent No.: US 8,230,807 B2
(45) Date of Patent: Jul. 31, 2012

(54) COATINGS, AND METHODS AND DEVICES FOR THE MANUFACTURE THEREOF

(75) Inventors: Gregory Robert Alcott, Liphook (GB); Mariadriana Creatore, Eindhoven (NL); Joannes Leonard Linden, Eindhoven (NL); Mauritius Cornelis Maria van de Sanden, Tilburg (NL)

(73) Assignee: ASM International N.V., Bilthoven (NL)

( * ) Notice: Subject to any disclaimer, the term of this patent is extended or adjusted under 35 U.S.C. 154(b) by 469 days.

(21) Appl. No.: 11/578,491

(22) PCT Filed: Apr. 14, 2005

(86) PCT No.: PCT/NL2005/000279
§ 371 (c)(1),
(2), (4) Date: Jul. 3, 2007

(87) PCT Pub. No.: WO2005/100633
PCT Pub. Date: Oct. 27, 2005

(65) Prior Publication Data
US 2008/0038484 A1 Feb. 14, 2008

(30) Foreign Application Priority Data
Apr. 14, 2004 (EP) .................................. 04076150

(51) Int. Cl.
 C23C 16/00 (2006.01)
 C23C 16/50 (2006.01)
 C23F 1/00 (2006.01)
 H01L 21/306 (2006.01)

(52) U.S. Cl. ............ 118/723 E; 118/715; 118/723 MP; 118/723 ER; 118/728; 156/345.43; 156/345.47; 156/345.51

(58) Field of Classification Search ............... 118/723 E, 118/723 MP, 722, 723 R; 156/345.33, 345.34, 156/345.38, 345.45; 977/841–844
See application file for complete search history.

(56) References Cited

U.S. PATENT DOCUMENTS

| | | | | |
|---|---|---|---|---|
| 5,024,927 A | * | 6/1991 | Yamada et al. | 430/270.14 |
| 5,948,167 A | * | 9/1999 | Baek et al. | 118/723 E |
| 6,126,778 A | * | 10/2000 | Donohoe et al. | 156/345.44 |
| 6,663,715 B1 | * | 12/2003 | Yuda et al. | 118/723 R |
| 2002/0142572 A1 | * | 10/2002 | Sakamoto et al. | 438/586 |
| 2005/0118427 A1 | * | 6/2005 | Linden et al. | 428/411.1 |

FOREIGN PATENT DOCUMENTS

| | | |
|---|---|---|
| EP | 0 443 400 | 8/1991 |
| JP | 2000 021245 | 1/2000 |
| KR | 2003 023 964 | 3/2003 |
| WO | WO 03/066933 | 8/2003 |
| WO | WO 03066933 A1 * | 8/2003 |

OTHER PUBLICATIONS

Laughton, M.A.; Warne, D.F. Electrical Engineer's Reference Book (16th Edition). Elsevier. Copyright 2003. No date. Section 9.10.*

* cited by examiner

*Primary Examiner* — Maureen Gramaglia
*Assistant Examiner* — Tiffany Nuckols
(74) *Attorney, Agent, or Firm* — Weingarten, Schurgin, Gagnebin & Lebovici LLP

(57) ABSTRACT

The present invention describes a method for manufacturing a low dielectric constant coating, which coating comprises an inorganic and an organic component, wherein precursors for these components are activated in at least two plasma sources for plasma activated deposition of a chemical vapor phase and wherein said activated precursors are combined before they are deposited from the chemical vapor phase on the substrate to form the coating, characterized in that said inorganic component comprises porous nanoparticles. The invention also describes a device for the manufacture of a low dielectric constant coating.

13 Claims, 19 Drawing Sheets

COATINGS, AND METHODS AND DEVICES FOR THE MANUFACTURE THEREOF

This application is a §371 national phase filing of PCT/NL2005/000279 filed Apr. 14, 2005, and claims priority to European application No. 04 076 150.4 filed Apr. 14, 2004.

BACKGROUND OF THE INVENTION

The invention relates to methods for the manufacture of coatings having low dielectric constants and to devices for the manufacture thereof.

As the dimensions of integrated circuit (IC) devices scale to smaller feature sizes, the resistance-capacitance (RC) delay of the metal interconnect is limiting the performance of high speed logic chips [1, 2]. Up until a decade ago, the resistance caused by interconnects in microprocessors was less than the switching time of transistors, so interconnect resistance was not a factor in microprocessor design. As scaling went into the submicron range, the small size of the wires became an issue. As wires get thinner, their resistance increases. Chip designers responded by switching from aluminum to copper as a material for the interconnects, copper being a superior conductor of electricity. Believing that the integration of low dielectric materials (k<2.5) may be also able to reduce this problem, chip designers have also looked at improving low-k dielectric materials between the wiring levels. Since reduced feature size coincides with a reduction in the distance between current carrying copper interconnects, the reduction in the spacing between the interconnects will cause an increase in cross talk between adjacent wires. Signal degradation as a result of cross talk can be compensated by reducing the dielectric constant of the material separating the interconnecting wires. But despite the presence of a number of candidate materials with dielectric constants k in the range of 2-3 [3], the interconnect issues are becoming increasingly problematic.

The dielectric constant or relative permittivity of a material is dependant on the material structure, polarization and polarizability [4]. A majority of low-k materials are based on a $SiO_2$ or amorphous hydrocarbon (a-C:H) layer [5-7] or on a hybrid layer that is an intermediate between the two. Carbon is less electronegative than oxygen, and hence the introduction of hydrocarbon moieties into $SiO_2$ reduces the dielectric constant. In a similar way, polar Si—OH groups create a large dipole, and although they indicate porosity due to the interruption of the Si—O—Si network, they increase orientational polarization and hence the dielectric constant increases.

It is known that the introduction of voids into the material may effectively reduce density of the material and has a much stronger effect on the dielectric constant than alteration of the polarizability. Most low-k dielectric candidate materials known today [25] are porous. The dielectric constant of silica ($k_{SiO_2}$) is 4, while the dielectric constant of air ($k_{air}$) is about 1. Notably, dense (i.e. non-porous) materials for semiconductor applications with a dielectric constant below 2.5 are not known [3]. Porous $SiO_2$ layers synthesized from various polyhedral oligomeric silsesquioxane (POSS) precursors [8-10] and prepared using sol-gel deposition techniques have produced thin films with dielectric constants typically between 2-3.

Sol-gel (wet chemical) processes with siloxane precursors have also been extensively studied [11-14], and reports of dielectric constants as low as 1.7 [15] have been reported using tetraethoxysilane (TEOS or tetra-ethyl-ortho-silicate) as a precursor. The low-k properties of these materials are achieved by a combination of low film density and a lowering of the polarizability by incorporation of CH moieties. Post deposition curing of these films can reduce the dielectric [16] constant by driving polar OH groups out of the material, but may also increase it as film densification reduces porosity.

Sol-gel (wet chemical) processes are a popular choice for fabricating low-k materials because they inherently produce porous materials. Materials with void volume fraction as high as 95% have been reported [14]. But despite the fact that highly porous materials with low dielectric constants have been obtained, their susceptibility and weakness make the low-k materials produced by sol-gel processes presently unsuitable for implementation into semiconductor processing.

Various problems are associated with porous $SiO_2$ layers. The porosity of these materials introduces technical problems when they are implemented into copper based interconnect integrated circuits (ICs). Porous materials are mechanically weak compared to dense materials, and porous materials are susceptible to damage during subsequent processing. In addition, porous materials are sensitive to wet and dry cleaning chemicals and they hold volatile compounds that when liberated contaminate subsequent processing steps [26]. Porous materials are also susceptibility to copper diffusion. For an overview of issues concerning the implementation of these porous materials in semiconductor processes reference is made to references [27-30] cited herein.

Gas phase technologies are an attractive alternative to wet chemical processes as they utilize existing vacuum reactors and toolsets in the semiconductor industries and can therefore be easily implemented into existing semiconductor processes. However, gas phase deposition techniques typically produce dense deposits. Synthesis of porous $SiO_2$ layers from siloxane precursors using expanding thermal plasma sources [17], plasma-enhanced chemical vapor deposition (PECVD) [18, 19] and reactive evaporation of SiO [20] have all been investigated, but only materials with k values of between 2.5-3 could be produced.

More recently Grill et al. [21, 22, 23, 24] attempted to synthesize porous low-k films by incorporating volatile organic hydrocarbon fragments into siloxane layers. By removing the volatile hydrocarbon fragments in a 400 °C post deposition annealing procedure, Grill et al. were able to produce porous layers exhibiting dielectric constants as low as 2.1. Unfortunately, conventional gas phase technologies offer insufficient control over the deposition chemistry and therefore less control over film structure and consequently polarizability. A drawback of the method of Grill et al. is that a post deposition curing is required, making the process more complex.

It is an object of the present invention is to provide methods for the application of a low-k coating that obviate the problems of the prior art.

It is another object of the present invention to provide a method for the implementation of a low-k coating into copper based interconnect integrated circuits with less technical problems.

It is yet another object of the present invention to provide a low-k coating having improved mechanical strength.

It is yet another object of the present invention to provide a low-k coating that is less susceptible to damage during subsequent processing.

BRIEF SUMMARY OF THE INVENTION

The present inventors have discovered that particulates with a fluffy density may be produced by a chemical vapor deposition (CVD) process. The term "fluffy" is herein used to indicate the non-dense character of the particulates and is herein synonymous with the term porous. The particulates are of nanometer dimensions. The inventors have further found that clusters of such fluffy particulates may become incorporated in a coating produced by CVD, providing such coatings with unique characteristics. The present invention is based on the discovery that porous nanoparticles of a controllable size may be formed in low pressure capacitively coupled discharges in a process of chemical vapor deposition (CVD).

The invention relates in one aspect to a method for manufacturing a low dielectric constant coating on a substrate by chemical vapor deposition and comprising incorporating nanoparticles in a polymer matrix, said method comprising:

i) activating precursors for said polymer matrix and precursors for said nanoparticles in at least one low pressure capacitively coupled plasma source, whereby precursor material for said nanoparticles is ionized into negative ions;

ii) trapping said negative ions in the electric field of said ionizing plasma;

iii) allowing condensation of additional activated precursor material on said trapped negative ions thereby allowing the formation of nanoparticles from said activated precursors in said plasma, and iv) allowing deposition of said activated precursors and said nanoparticles from the chemical vapor phase on the substrate to form the coating.

The coatings may be used for various purpose. The present inventors have now discovered that materials for semiconductor applications with a dielectric constant below 2.5 can be produced in a reproducible and controlled manner by a method of the present invention. This is of particular interest to low-k semiconductor applications because these porous nanoparticles can be synthesized and incorporated into a simultaneously synthesized silicone layer.

When performing a chemical vapor deposition process wherein these porous nanoparticles are produced and incorporated in a coating that may be produced simultaneously by yet another chemical vapor deposition process, the dielectric constant of the resulting coating may be modified in a controlled manner to low levels and the coating may be deposited by methods compatible with current chip-making processes.

In a preferred embodiment of a method according to the present invention the precursors for the nanoparticles and the precursors for the matrix are activated in at least one plasma source for plasma activated deposition of a chemical vapor phase wherein said activated precursors are combined before they are deposited from the chemical vapor phase on the substrate to form the coating.

A preferred method of the invention comprises the embodiment wherein said coating comprises an inorganic and an organic component and wherein precursors for these components are activated in at least two separate plasma sources for plasma activated deposition of a chemical vapor phase, thus producing a hybrid coating.

Although a single plasma source for producing both the nanoparticles and the coating matrix may be used, a preferred method relates to the manufacture of hybrid coatings comprising both organic and inorganic phases. The use of at least two plasma sources for the deposition of such a mixed phase material is deemed necessary, as the two material phases require separate process conditions. For instance, oxygen is required for the synthesis of $SiO_2$ particles, but would be detrimental to the polymer chemistry causing oxidation of the hydrocarbon content of the polymer.

A method of the invention is in a preferred embodiment performed by using at least two capacitively coupled plasmas. Although the present inventors have not yet been able to quantify the porosity of the porous nanoparticles as part of the coatings of the present invention, it is believed that the manner in which these particles are formed results in porous polymer networks. Traditionally, particles are considered contaminants in CVD methods. However, by optimizing the formation of particles, the present inventors were able to discover the advantages of the methods and coatings claimed herein. It is believed that the particles are formed from negative ions trapped in the plasma glow and the sheath surrounding them. The energy of ions impinging on the negative ions should be low relative to the sheath region above the electrode in order to avoid formation of dense particles.

Particles prepared from a $TEOS/O_2$ gas mixture and collected post-deposition from a capacitively coupled discharge were found to coagulate into extremely light structures that were easily affected by electrostatic forces. Small angle x-ray diffraction (SAXS) measurements did not reveal any long range order within the particle structure, indicating that the particles consisted of a porous $SiO_2$ network.

The methods of the present invention typically employ cold plasmas, i.e. plasma wherein the neutral gas temperature is low (e.g. <2000° K., preferably <1000° K., e.g. about 400-500° K.). Such low energy systems enhance the formation of fluffy (non-dense) particles.

The methods of the present invention typically employ capacitive systems comprising an electric field for trapping of negative ions and particles (preferably the particle experiences a gradient in electric field as it is pulled by gravity).

The methods of the present invention typically employs a CVD process that is optimized for particle formation wherein negative ions obtained from activated precursors act as condensation nuclei for additional activated precursor material within the chemical vapor phase. Furthermore, the methods of the present invention preferably use pulsed electric fields to allow deposition of the formed particles from the plasma onto the substrate.

The invention also relates to a low dielectric constant coating which is obtained according to a method of the invention and to products which comprise such a low dielectric constant coating.

A coating obtained by a method of the present invention is characterized by an amorphous internal structure, and has a high surface roughness. Typically, the surface is pebbled, granular or bumpy due to the presence in said coating of nanoparticles having a diameter of less than 450 nm, more preferably a diameter of less than 200 nm, still more preferably less than 100 nm, even more preferably between 50 and 150 nm, while a cross sectional view of a cleaved coating reveals no such nanoparticles on the cleaving surface (FIG. 3, left panel, showing bumpy coating surface [top half of picture] and smooth cross sectional cleaving surface [bottom half of picture]). Thus, SEM images of fracture surfaces show a distinct fracture behavior of the coating of the present invention. The absence of particles in the cross sectional ESEM images, or at least the absence of any evidence of the presence of particles at the fracture surface in such images, suggests that the particle are mechanically weak and their structure or composition is, like that of the surrounding matrix, not that of dense silicate. If the particles were dense and the intermolecular Si—O bonds within the particle was strong, then the particles should not break and would therefore be visible in the cross sectional SEM image. However, the absence of particles in the cross sectional ESEM image suggests the particles break apart internally instead of separating from the coating (See FIGS. 3 and 4).

Typically coatings of the present invention have a low density and exhibit high thermal stability. Silicon-based coatings (e.g. obtained with a TEOS/$O_2$ gas phase) resulted in particles that were thermally stable up until temperatures in excess of 800° C.

In order to perform a preferred method of the invention a dual capacitively coupled plasma reactor is described herein, that may be used to synthesize porous nanoparticles and incorporate them into a simultaneously synthesized coating matrix, such as for instance a silicone layer. The nano-porosity of these particles is used to introduce controlled porosity into the silicone layer thereby producing a low-k coating or layer.

The present invention therefore relates in another aspect to a device for applying a coating to a substrate through plasma activated deposition of a chemical vapor phase, which device comprises a reactor space provided with a carrier for a substrate, and at least two capacitively coupled plasma (CCP) sources, wherein said plasma sources are situated in the processing direction, such that precursors activated in at least two plasmas are combined before being deposited on the substrate. In a preferred embodiment, said device is adapted for the manufacture of a low dielectric constant coating, preferably of an inorganic and an organic component, to a substrate through plasma activated deposition of a chemical vapor phase.

DETAILED DESCRIPTION OF THE INVENTION

Figure 1:
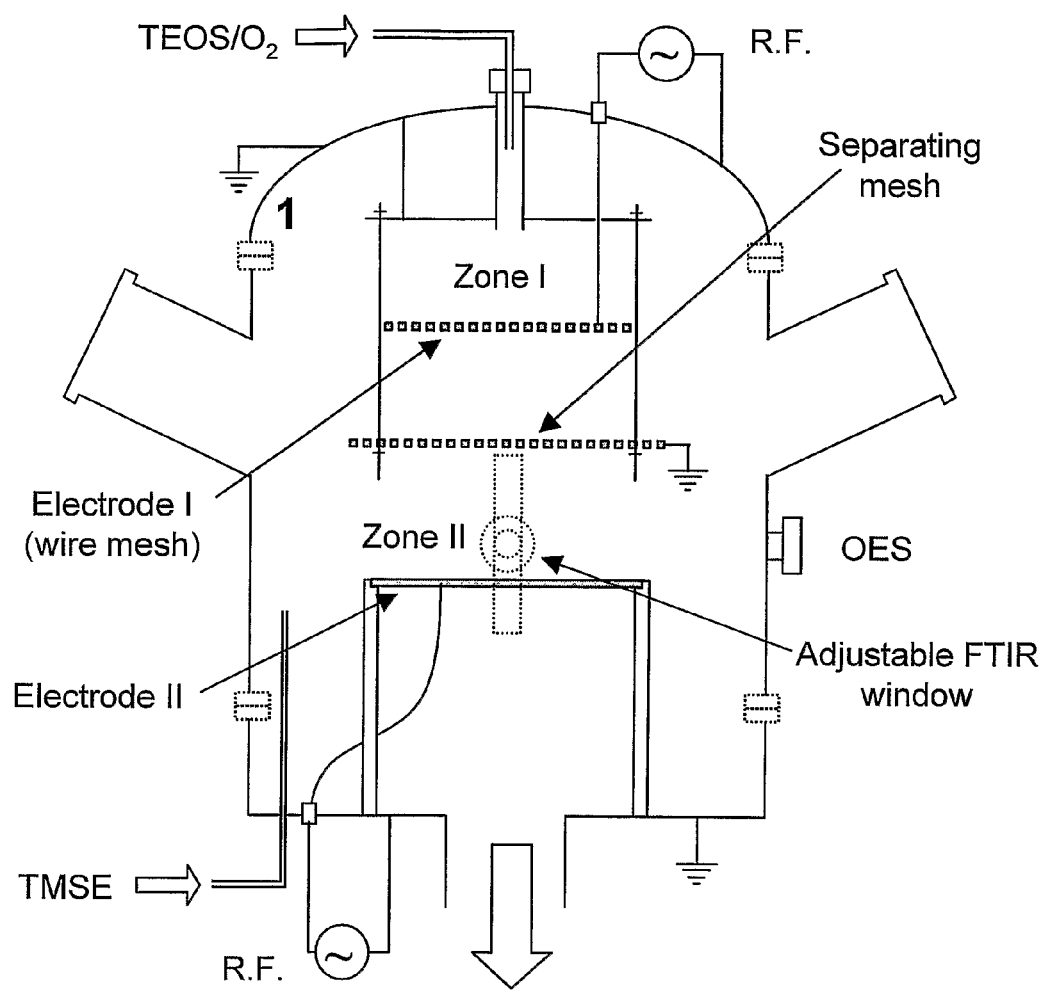
FIG. 1 shows an embodiment of the device of the present invention which consists of dual CCP deposition system, the details of which are described herein below.

Throughout this description the symbol k has been chosen to represent the dielectric constant s, in line with nomenclature used in the semiconductor industry. A low dielectric material is generally considered a material having a dielectric constant k of less than 2.5.

As defined herein, a coating comprising a material with a low dielectric constant, which coating is herein also referred to as a "low dielectric constant coating" or "low dielectric coating", exhibits a dielectric constant k of less than 2.5, preferably less than 2.0, more preferably less than 1.9.

Unless otherwise specified herein, Standard Temperature and Pressure (STP) is equivalent to 0° C. at 760 mm Hg.

A low dielectric coating according to the invention comprises an integrated network of an inorganic component and/or an organic component, which network serves as a matrix for porous nanoparticles incorporated therein.

A low dielectric coating manufactured according to a method of the invention is built up as an interwoven network of polymers that serves as a matrix for porous nanoparticles that are incorporated therein, preferably in homogeneous distribution.

Coatings, including low dielectric materials, according to the present invention, may be built up from a large variety of inorganic and/or organic matrix components which are chemically bonded to each other at a molecular level. Thus, a coating according to the invention can comprises an inorganic (for instance glassy) network that has been modified with organic residue groups as a matrix structure. The matrix structure for such a coating can comprise an organically modified inorganic network based on a metal oxide, metal carbide and/or metal nitride or, preferably, a silicon oxide, silicon carbide and/or silicon nitride in case of a low dielectric constant coating. Through the character of the plasma activated deposition according to the invention, the organic residue group that modifies the inorganic network can take any form in which carbon, silicon and optionally oxygen atoms or carbon, metal and optionally oxygen atoms are combined with each other. In order to be useful as a low dielectric constant coating according to the invention $SiO_2$ or Si-based polymers, carbon based polymers and fluorocarbon based polymers are preferred.

For the metal, any metal can be chosen. Preferably, the metal is selected from the group consisting of aluminum, cadmium, cerium, chromium, cobalt, gold, copper, lanthanum, lead, manganese, molybdenum, nickel, osmium, palladium, platinum, tin, titanium, vanadium, tungsten, iron, silver, zinc, zirconium, alkali metals and alkaline earth metals. More preferably, the metal is Al, Mo, Ti, Zr, Cs, Pt or Sn.

An alternative coating that can be realized by the use of a method according to the invention comprises a matrix of organic polymers which have been bonded together to form a continuous or discontinuous matrix. The coating of the present invention then further comprises inorganic very small particles (nanoparticles) of metal or silicon oxides or inorganic network structures then forms the coating.

Another alternative coating that can be realized by the use of a method according to the invention comprises an inorganic matrix which further comprises porous nanoparticles.

Yet another alternative coating that can be realized by the use of a method according to the invention comprises a hybrid matrix, comprising an inorganic component and an organic component, which matrix comprises porous nanoparticles. A low dielectric coating according to the invention is preferably formed by an integrated network of an inorganic component and an organic component. Thus, the coating preferably has a hybrid character.

The nanoparticles incorporated in the dielectric coating of the invention may or may not be covalently bonded to the matrix, they are preferably inorganic, and may comprise e.g., silicon oxides, metal oxides, silicon carbides, metal carbides, silicon nitrides and/or metal nitrides or combinations and inorganic network structures thereof.

Preferably the nanoparticles incorporated in the coating of the present invention are formed as a network of silicon oxides, metal oxides, silicon carbides, metal carbides, silicon nitrides and/or metal nitrides.

The nanoparticles preferably have a diameter of less than 450 nm, more preferably a diameter of less than 200 nm, still more preferably less than 100 nm. Preferably, in an embodiment according to the present invention, nanoparticles are formed and incorporated having a diameter between 1 and 200 nm. With greater preference, the nanoparticles possess a diameter between 50 and 150 nm.

The porosity of the particles is preferably >25%, more preferably >50%, still more preferably >75%, still more preferably >90%, and still more preferably >95%. The highest values leading to the highest reduction in the dielectric constant. He skilled person will readily understand that the porosity may be chosen such that sufficient reduction in dielectric constant is achieved while maintaining sufficient mechanical strength. Further the density of the particles in the coating also may be chosen by the skilled person to achieve a desired low dielectric constant of the coating while maintaining sufficient mechanical strength of the coating.

The coating of the invention preferably has a thickness of 0.01 to 100 μm, preferably from 0.1 to 10 μm, more preferably from 1 to 2 μm. In fact, the coating is preferably thicker than the diameter of the particles, in order for it to exhibit sufficient mechanical strength. This is especially the case when the porous particles themselves have insufficient mechanical strength. Preferably, the thickness of the coating in that case is at least 1.5, more preferably at least 2 times the diameter of the particles.

The different constituents or components of a low dielectric coating (i.e. of matrix and particles) are preferably formed from precursor molecules in a process of precursor activation. During this activation, the precursor molecules are dissociated. Dissociation of the precursors can be done by means of thermal dissociation, laser dissociation or other suitable methods that are known in the art. A particular preference is expressed for a method whereby the precursor molecules are activated by means of a plasma. According to the present invention, with great preference, the activation of the organic and inorganic precursors takes place in separate plasmas.

For the formation of an inorganic component, in many cases a precursor for a metal oxide, metal nitride, or metal carbide or a silicon oxide, silicon nitride or silicon carbide will be used. Since in the plasma strong dissociative activation takes place, as precursor for an inorganic component, compounds that comprise a direct metal-carbon, a metal-hydrogen, a metal-nitrogen, a metal-halide, or a metal-oxygen bond, such as organometal or metallorganic compounds, metal alkoxydes, metal halides, metal carboxylates, or metal-8-diketonates can be chosen. It is also possible to use, as precursor for an inorganic component, compounds which comprise a direct silicon-carbon, a silicon-hydrogen, a silicon-nitrogen, a silicon-halide, or a silicon-oxygen bond, such as organosilicon compounds, silicon alkoxydes, silicon halides, siloxanes, silanes, silazanes, silicon carboxylates, or silicon-β-diketonates.

In case an organometal compound is selected, for the metal, any metal can be selected. Preferably, the metal is selected from the group consisting of aluminum, cadmium, cerium, chromium, cobalt, gold, copper, lanthanum, lead, manganese, molybdenum, nickel, osmium, palladium, platinum, tin, titanium, vanadium, tungsten, iron, silver, zinc, zirconium, alkali metal and alkaline earth metal. Preferably, the metal compound is selected from the group consisting of a metal alkoxyde, carboxylate or -β-diketonate. With greater preference, the organometal compound is a metal alkoxyde, carboxylate or β-diketonate in which the metal is Al, Mo, Ti, Zr, Cs, Pt or Sn.

For the formation of the nanoparticles, preferably a part of the inorganic component is deposited in the form of nanoparticles. These nanoparticles are formed through substantially complete dissociation of the inorganic precursors, such as, for instance, the metal or silicon alkoxydes, and condensation of activated molecules to virtually crystalline nanoparticles. Once captured and optionally covalently bound in the low dielectric coating, these nanoparticles offer the advantage that they impart porosity to the coating thus providing for a coating with a low dielecytic constant.

The porous particles may be formed by any CVD method that results in crystallization or nucleation and condensation of activated precursors. More preferably, use is made of a plasma source comprising a self biasing r.f. electrode mesh, preferably as indicated as Zone I in FIG. 1, which plasma source acts to trap negative precursor ions that may form condensation nuclei for additional precursor materials, thus leading to particle growth in this region. Preferably, after being produced in a first plasma (Zone I in FIG. 1), the particles are transported into a second plasma by traversing the r.f electrode mesh. In said second plasma the particles may be combined with the polymer or matrix-forming chemistry. Thereafter the combined precursors are deposited on a substrate in order to form a coating according to the invention.

The r.f electrode mesh may be constructed of any suitable material. Generally nickel, steel, tungsten, etc. are used as a material for the r.f. electrode mesh. The top electrode may have a mesh with a hole diameter of about 0.01 to about 10 mm, preferably the hole diameter is about 1 mm. This diameter proved suitable in order to insure that the sheath (horizontal electric field) thickness (~5 mm) was larger than the hole diameter and that no hollow cathode discharges would ignite in the electrode and disrupt the trapping electric field.

The precursors may be evaporated and dosed using any suitable gas delivery system, for instance by using a purging system wherein a carrier gas is bubbled through a liquid precursor, thus carrying the precursor as a vapor into the reaction chamber.

When an organic molecule is introduced into a plasma, the monomer draws energy from the plasma through non-elastic impacts and it is activated and fragmented into activated smaller molecules. The activated monomers combine with each other, thereby forming larger molecules, eventually resulting in a polymer. Because the plasma will fragment most organic compounds, plasma polymers can be deposited from virtually any organic monomer. Plasma polymers are in most cases highly branched and crosslinked, in most cases they are insoluble and adhere to solid surfaces. The chemical and physical properties of the plasma polymers depend on the precursor used, which is mostly introduced into the plasma in gas or vapor form, and the type of discharge (e.g. direct current, radiofrequency waves or microwaves) and the energy power introduced.

As precursor for an organic component, a multiplicity of organic compounds can be used. In fact, basically all conceivable organic substances can be activated as precursor in the organic plasma, and the components that are formed therefrom can be used in coatings according to the present invention.

As precursor for an organic component, in general, alkanes, alkynes, alkenes, arenes and optionally wholly or partly (cyclo)alkyl-, aryl-, aralkyl-, allyl-, methoxy-, halogen-, hydroxy-, amino-, nitro-, cyano-, epoxy, glycidoxy, (meth)acrylato or aromatic group substituted derivatives thereof are suitable for use in the present invention. Preferably, short chain alkanes ($C_{1-6}$), acrylate, styrene or carbon-fluorine compounds ($CF_4$, $C_2F_4$, $C_2F_6$ and $C_4F_{10}$) are used as organic precursor.

In the present description, the term alkanes is understood to refer to acyclic, branched or unbranched hydrocarbon of the general formula $C_nH_{2n+2}$ having from 1 to 10, preferably from 1 to 8 carbon atoms, such as ethane, methane, propane and pentane.

The term alkenes is understood to refer to acyclic branched or unbranched hydrocarbon having one double carbon-carbon bond and a general formula of $C_nH_{2n}$ having from 1 to 10, preferably from 1 to 8 carbon atoms. This is also understood to include the acyclic branched or unbranched hydrocarbons having more than one double carbon-carbon bond such as alkadienes, alkatrienes, etc.

The term alkynes is understood to refer to acyclic branched or unbranched hydrocarbons having a triple carbon-carbon bond and having the general formula $C_nH_{2n-2}$ having from 1 to 10, preferably from 1 to 8 carbon atoms. This is also understood to include the acyclic branched or unbranched hydrocarbons having more than one triple carbon-carbon bond, such as the alkadiynes, alkatriynes, etc.

In the present description, the term alkyl group refers to a monovalent group derived from an alkane through the removal of a hydrogen atom from one of the carbon atoms and comprises a straight chain or branched chain having from 1 to 10, preferably from 1 to 8 carbon atoms. The term (cyclo) alkyl group refers to an alkyl group or a cyclic alkyl radical. These last also encompass saturated or partly saturated monocyclic, bicyclic or tricyclic alkyl radicals in which each cyclic group contains 3 to 8 carbon atoms. Examples of such radicals are methyl, ethyl, n-propyl, isopropyl, n-butyl, isobutyl, sec-butyl, tert-butyl, pentyl, iso-amyl, hexyl, octyl, cyclopentyl, cyclopentenyl, cyclohexenyl, cyclohexyl, cyclopentadienyl and cyclooctadienyl.

The term aralkyl means an alkyl as defined above, in which one hydrogen atom has been replaced with an aryl group as defined above. Allyl refers to propene radicals $(CH_2)_2CH$. Halogen refers to fluorine, bromine, iodine or chlorine.

The term aromatic group refers to arenes and substituted derivatives thereof, such as benzene, naphthalene, toluene and should be understood as comprising the heteroaromatic structures, such as thiophene and pyridine. Arenes refer to the monocyclic and polycyclic aromatic hydrocarbons. The term aryl refers to an aromatic or heteroaromatic ring system obtained from arenes by removal of a hydrogen atom from a ring carbon atom, such as a phenyl, naphthyl or anthracene group, optionally substituted with alkyl, methoxy, halogen, hydroxy, amino, nitro, or cyano.

Organosilicon compounds, such as polydimethylsiloxanes (PDMS) with terminal trimethylsiloxy, hydroxy or hydride groups, hexamethyldisilazane (HMDSN), hexamethyldisiloxane (HMDSO), 1,3-divinyltetramethyl disiloxane (DVS), vinylpentamethyldisiloxane (VPMDSO), 1,1,3,3-tetramethyldisiloxane (TMDSO), 1,3,5,7-tetramethyl cyclotetrasilane (TMTSO), 2,4,6,8-tetravinyl-2,4,6,8-tetramethylcyclotetrasiloxane (TVTMTSO), diacetoxy-di-tert-butoxysilane (DADBS), triethoxysilane (TRIES) methyltrimethoxysilane (MTS), 1,2-bis(trimethylsilyloxy)ethane (TMSE), tetramethoxysilane (TMOS), tetraethoxysilane (TEOS), octamethyltrisiloxane (OMCTS), or tripropylsilane (TPS), organometal compounds and metal organic compounds also find very suitable application in embodiments according to the present invention and can be used with advantage as precursor of the organic as well as of the inorganic component.

Poly(p-xylylene), or parylene-N, can also be used with advantage as precursor for the organic component, as well as dimers, such as di-p-xylylene, or monomers, such as p-xylylene, and optionally functionalized compounds obtained or derived therefrom.

By 'optionally functionalized' is meant that these compounds may be chemically derivatized, so that, incorporated into the coating, they impart to this coating a functional property such as biocompatibility, hydrophobicity, anti-reflection or anti-stick properties. This can be realized, for instance, by the use of halogen functionalized derivatives, while the starting compounds have been halogenated with, for instance, fluorine or chlorine. Examples of functionalized compounds that can be used as precursor for the organic components are PPXC ([—$CH_2$—$C_6H_3Cl$—$CH_2$—]$_2$ as dimer), and AF-4 ($CF_3$—$C_6H_4$—$CF_3$).

The ratio of inorganic precursor/organic precursor can be varied, to obtain a more, or less, flexible material.

In the present invention, a plasma is understood to mean a gaseous or vaporous composition of constituents which under the influence of electric energy generated by a plasma source, has been brought to (gas) discharge. The space in which this discharge is effected is limited by an electric field which is generated by an electric power source and by a physical separation, if any is present, such as, for instance, a glass tube, and is called a plasma source.

In a wider sense, plasma source in the present invention is understood to mean an electric power source and the electrodes for generating an electric field as well as the space limited by this field, for discharge and activation of a gaseous or vaporous composition of constituents and any physical separation present. If in the present description properties or embodiments are assigned to the plasmas, these properties or embodiments also hold for the plasma source as far as they relate to it, and vice versa.

A coating according to the invention with can be very suitably obtained by the use of a single plasma source. In this case both the particles and matrix chemistry are produced in a single plasma. Preferably however, and especially when different chemistries are used for the particles and matrix of the coating at least two plasma sources are used in devices and methods of the present invention, preferably both being of the capacitively coupled type. However, two or more plasma sources of different type can also be used in the present invention. Preferably low electron density plasmas are employed.

A high electron density plasma source typically has an electron density between $5 \times 10^{16}$-$5 \times 10^{19}$ electrons/m$^3$. An example of such a plasma source is an ICP (inductively coupled plasma) plasma source or an ECR (Electron Cyclotron Resonance). A low electron density plasma source typically has an electron density between $5 \times 10^{10}$-$5 \times 10^{16}$ electrons/m$^3$. An example of a low electron density plasma source is a CCP (capacitively coupled plasma) plasma source or a DC (direct current) plasma source.

Electron densities can be determined with methods known for that purpose, such as the Langmuir probe method, microwave or laser interferometry, or Thomson scattering.

A plasma composition in the present description is defined as a gaseous or vaporous composition which is supplied to the electric field generated by the plasma source to obtain the plasma regardless of whether this composition has already been brought to discharge.

A general embodiment of a device according to the invention for manufacturing a low dielectric coating comprises a reactor space in which the chemical vapor deposition onto the substrate takes place and which is limited by a reactor vessel. The reactor space is provided with a carrier for a substrate. The device further comprises at least two separate plasma sources for the activation of the inorganic and organic precursor components.

Different preferred embodiments of such a device are suitable for manufacturing low dielectric coatings according to the invention. A preferred embodiment is represented in FIG. 1. There is shown a reactor vessel, the top of which is provided with a precursor inlet (indicated with TEOS/O$_2$) through which supply of a precursor, a carrier gas and optionally oxygen can take place. The vessel wall is suitably provided with a grounding.

Through provision of electrodes one or more plasma sources may be situated in the reactor space that is enclosed by the vessel. First and second plasmas may be provided a by means of a first and second plasma source. One of the electrodes may also be a carrier for a substrate.

In FIG. 1, Zone I denotes the region of the first plasma, wherein particles are formed. Zone I is part of a plasma source that is delimited by a top plate and a separating mesh. The separating mesh is suspended from the top plate by way of a suspension device and is provided with a grounding, thereby also grounding the top plate. The first plasma source further comprises an electrode I in the form of a wire mesh (also termed "r.f. electrode mesh" herein) which is positioned in between the top plate and the separating mesh and which is provided with a radiofrequency (R.F.) charge. Electrode I is capable of discharging on both the separating mesh and the top plate. Precursors entering the first plasma source will become ionized in a plasma generated by said source and negative ions will become entrapped in the plasma thus generated in the region labeled Zone I of the first plasma source. Upon reaching sufficient size, and through the use of pulsed fields, the particles may fall through the separating mesh and reach the second plasma source.

In FIG. 1, Zone II denotes the region of the second plasma wherein the matrix chemistry is formed. Zone II is part of a second plasma source that is delimited by the separating mesh described above for the first plasma source and by electrode II. Electrode II may function as the substrate carrier. This plasma source can be provided with its own precursor inlet (indicated by TMSE). The reactor may further be fitted with components that facilitate measurements to be performed on the plasmas (indicated by "OES" and "adjustable FTIR window" in FIG. 1). When the device of FIG. 1 is in operation, the precursors, carrier gas and optionally oxygen will react in Zone I to create porous nanoparticles. By a combination of physical transport effects but mainly gas flow and gravity these particulates are transported from Zone I to Zone II. The nanoparticles that reach Zone II will be combined with the matrix-forming chemistry produced in the second plasma, which plasma is produced as a result of ionization of precursors entering the inlet for the second plasma source and nanoparticles will be incorporated into the growing polymer layer. As a consequence, the substrate provided on the carrier is covered with a combination of both plasma products thus producing the coating on the substrate.

This embodiment, however, concerns one of the possible embodiments and should not be construed as limiting the scope of the present invention. It will be clear to those skilled in the art that variations on the above described device are possible. Thus, it is possible to uncouple the plasmas. The design of the electric power sources, the manner in which the electric power source is arranged and the charge carriers are mutually coupled, and the distance between plasma and carrier for the substrate are not critical and can be adjusted. Suitable configurations for obtaining desired material properties can be determined through optimization.

The first plasma source is preferably a low electron density plasma. Further, the first plasma source is preferably a high-frequency plasma. More preferably the first plasma source is a CCP plasma.

The second plasma source (if present) is preferably a low electron density plasma. Further, the second plasma source (if present) is preferably a high-frequency plasma. More preferably the second plasma source (if present) is a CCP plasma.

Still more preferably, both plasmas are CCP plasmas.

A frequency of between 0.01 MHz and 10 GHz in this connection is very suitable for inducing discharge in the plasmas. It is greatly preferred that a frequency of between 1 and 50 MHz be used.

Preferably, the coupled plasmas applied are high-frequency plasmas. A frequency of between 0.01 MHz and 10 GHz in this connection is very suitable for inducing discharge in the plasmas. It is greatly preferred that a frequency of between 1 and 50 MHz be used.

The plasmas can be situated in the direct vicinity of the substrate or at some distance therefrom. The situation where the substrate is arranged directly between the two electrodes (Electrode II and Separating mesh, see FIG. 1) of the second plasma source in which cases a so-called direct plasma is involved, results in a higher thermal load on the substrate under the influence of exposure to high energy particles.

Although not all substrates are suitable for high thermal loading, direct plasmas can still be used with great advantage in the present invention.

Preferably, in a device according to the invention, at least one plasma source is situated at some distance from the substrate. Such "remote" plasmas therefore find particularly suitable application in the present invention.

To pass the particles activated in the remote plasma to the substrate, it is practical that a device according to the invention be provided with transport means for a vapor phase. Such means can comprise "passive" means such as gravity, whereby the remote plasma, the substrate and the field of gravity are in one line. Also, active transport means for a vapor phase can be included in a device according to the invention. Such active systems can consist of a pressure gradient or an active air, vapor or gas stream in the processing direction. 'Processing direction' as used herein is the direction in which a plasma-activated particle must travel to reach the substrate and to deposit thereon.

An active air or gas stream can be generated by introducing air, vapor or gas with excess pressure into the device. To that end, a carrier gas such as $N_2$, argon, or any other suitable unreactive gas, or a gas involved in the activation reaction, such as oxygen, can be used.

Alternatively, an active air, vapor or gas stream can be generated by extracting air, vapor or gas from the device. The manner in which the pressure gradient or the active air, vapor or gas stream is obtained is not of preponderant importance in methods and devices of the invention. Preferably, the transport means for a vapor phase are realized by introducing gas with excess pressure into the device and simultaneously extracting vapor from the device, so that a reduced pressure, with respect to atmospheric pressure, is created in the device. This further promotes a stable plasma discharge. A pressure between 0.01 and 1000 mbara finds suitable application in embodiments according to the present invention. Good results have been obtained at a pressure in the device between 0.1 and 50 mbara.

The plasmas that can be used in the present invention are aimed at forming from precursor molecules, reactive intermediates that can be deposited on the substrate. Depending on the energy supplied to the plasma source, the precursor will be activated into a reacted and dissociated intermediate. The extent of dissociation can be set by choosing the level of the plasma source energy. Suitable powers in plasmas that are used in embodiments of the present invention are generally between 10 and 2500 Watts, with voltages varying between 0.001 and 5000 Volt.

Preferably, the plasma is pulsed to liberate the particles captured therein from the plasma volume and to effect deposition on the substrate to be coated. Preferably, a pulse frequency of 1 to 100 Hz is used. With greater preference, a pulse of approximately 25 Hz (with a duty cycle between 5 and 10%) is used.

Concentrations of precursors in a plasma composition according to the invention are generally between 1 and 25 vol. %. Optionally, in addition oxygen can be supplied to the plasma composition to a concentration of approximately 80%.

Besides precursor molecules, the plasma composition comprises an unreactive carrier gas such as $N_2$ or a noble gas such as argon, helium, neon, krypton, radon and/or xenon or a combination of these gases to supplement the volume. The plasma volume is preferably supplemented with argon gas. The formation of the inorganic precursor plasma is preferably effected by bringing the mixture of oxygen, precursor molecules and argon gas to electric discharge in a plasma source.

The reactions thereby occurring lead to dissociation or activation of the precursor molecules.

Upon leaving the plasma, the activated intermediates preferably move substantially towards the substrate on which they can deposit and if possible substantially polymerize/condense. A considerable advantage of the present invention is that it is possible according to the proposed method to adjust the composition, and hence the properties of the low dielectric coating, to any desired specification or application.

The ratio of inorganic to organic components, the density of the low dielectric material that is manufactured in this way and the amount of nanoparticles present can be fully controlled. In this way, many different specific properties can be imparted to the material. Also, to the different plasmas additives can be added, enabling specific properties to be imparted to a coating according to the invention.

Any substrate is suitable to be clad with a coating according to the invention provided that the activated intermediates can adhere to it. Suitable substrates for applying a coating according to the present invention are substrates generally used in the semiconductor industry, and may for instance include plastic, metal, glass and ceramics.

The thickness of the coating can be adjusted by varying the vapor deposition time (the period in which the substrate is exposed to the chemical vapor phase). Thicker coatings are achieved after longer vapor deposition times. Optionally, the deposition rate of the different activated components can be increased by supplying more energy to the plasmas or by increasing the gas or vapor stream through the device.

The substrate can optionally be cleaned or otherwise treated to improve the adhesion of activated intermediates, and hence the entire coating. Such treatment methods are known in the art and comprise treatment with, for instance, HF, $NH_4OH$ or $H_2SO_4$, or with the aid of a plasma according to methods known for that purpose.

EXAMPLES

Example 1

In this Example a dual capacitive plasma reactor is used in combination with a process to synthesize nanoporous particles and simultaneously incorporate them into a silicone layer. The nanoporosity of these particles is used to introduce controlled porosity into the silicone layers with the aim of producing low-k layers. Nanocomposite layers exhibiting dielectric constants of 1.82-1.86 (1.82±0.02) have been demonstrated, compared to 3.05 for similar layers without particle incorporation.

Reactor

The reactor design comprises two capacitively coupled plasma systems each connected to a power of 1 kW at 13.56 MHz supplied through matching networks (FIG. 1). The plasmas may or may not be pulsed, preferably they are pulsed. The precursors and gasses, e.g. TEOS and oxygen, for particle synthesis, may be fed into Zone I, e.g. through the top inlet indicated, where they are activated by the plasma formed between the radio frequency (r.f.) electrode mesh (i.e. the mesh acting as electrode carrying a radio frequency current) and the top and bottom plates of the chamber defining Zone I.

The self biasing of the r.f. electrode mesh acts to trap negative ions so that they may nucleate particle growth in this region.

Both plasmas can be modulated so that particles trapped in Zone I can traverse the r.f. electrode mesh and flow into Zone II where they are combined with the polymer forming chemistry.

Figure 2:
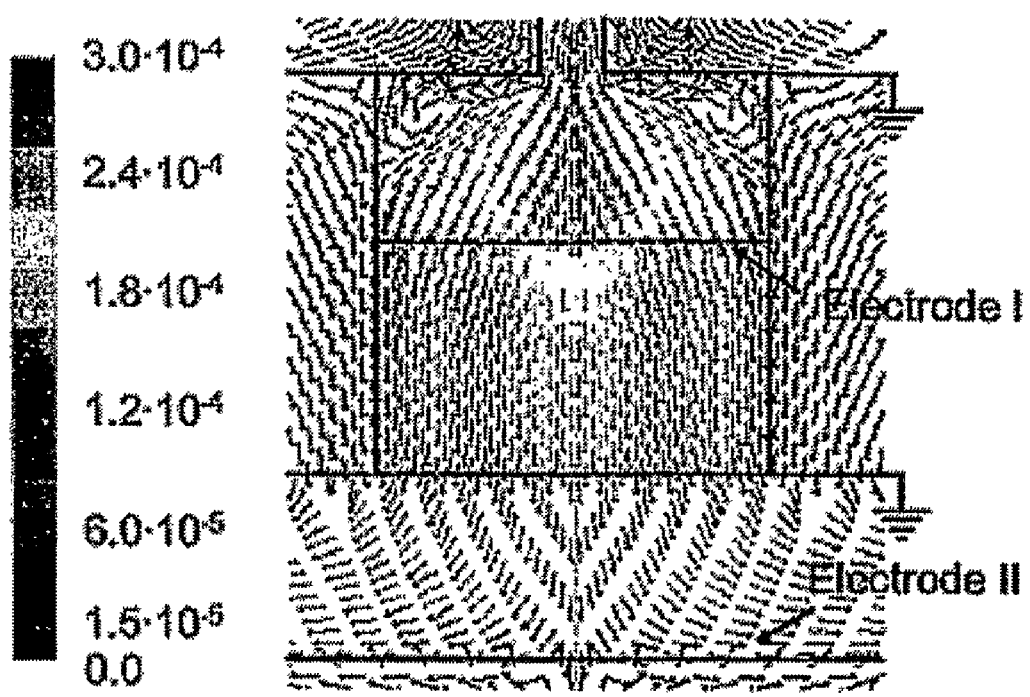
FIG. 2 shows a computational fluid dynamic (CFD) model of reactor flows in m/s for the device in FIG. 1, as described in the Examples below.

Using the above described device, a computational fluid dynamic (CFD) model of the particle forming region was made to identify recirculation or stagnation regions caused by the geometry (FIG. 2). The mesh electrode and grounded plate separating the two plasma regions have a open area of 38%. The skilled person will appreciate that proper selection of the open area will produce a more laminar flow at the substrate (Electrode II) and consequently a more homogenous film deposition profile.

Experimental Setup

Particles were synthesized, trapped and monitored using a capacitively coupled r.f. discharge. A steel substrate table acted as the driven electrode and was surrounded by a grounded steel cage to contain the plasma. In one experiment, no cooling systems were implemented and the substrate typically reached a temperature of 100° C. during film growth or particle synthesis which typically lasted about 10 minutes. Infrared spectroscopic measurements were done using a Midac M2500-C Fourier transform infrared spectrometer (FTIR) that consisted of two units. The detector unit housed the Mercury Cadmium Telluride (MCT) detector, while the source unit housed the Michelson interferometer and glow bar source. The two instrument units were positioned on either side of the reactor and the infrared beam (Ø=2 cm) passed over the driven electrode clearing the substrate table by 3 mm. Spectra were recorded using a spectral resolution of 1 $cm^{-1}$ and averaging 10 consecutive scans to improve the signal-to-noise ratio. Infrared spectra were deconvoluted using the Peak Fit (Systat Software) and heights of absorbance features were used to monitor variation in species concentration.

The tetraethoxysilane precursor [CAS 78-10-4] 98% purity was evaporated and dosed using a Bronkhorst HiTec CEM system while argon and oxygen flows were controlled using Bronkhorst HiTec mass flow controllers. All gas lines to the reactor were heated to 80° C. to prevent condensation of the TEOS precursor. A MKS throttle valve located in the reactor exhaust system regulated the reactor pressure, which was constant during each experiment. In order to embed $SiO_2$-like particles in an organic matrix, conditions for synthesis and trapping of particle were combined with conditions optimized for growing a-C:H layer. This was done by first synthesizing the particles, purging the precursor gases while holding the $SiO_2$ particles in the plasma sheath above the electrode and then injecting methane. The methane deposited on the substrate and particle surfaces to form an amorphous carbon layer, in which the particles became embedded. A summary of the experiments and process conditions are presented in Table 1.

TABLE 1

Experimental condition for particle synthesis and trapping.

| Experiment | Power [Watt] | Fraction TEOS | Fraction $O_2$ | Fraction $CH_4$ | Flow [sccm] | Pressure [Torr] |
|---|---|---|---|---|---|---|
| Particle synthesis | 100-500 | 0.05-0.3 | 0-0.7 | 0 | 100-300 | 1 |
| Mushroom formation | 200-300 | 0.1-0.2 | 0.5 | 0 | 56 | 0.5-1 |
| Hybrid simultaneous | 300 | 0.2 | 0.5 | 0.2 | 200 | 1 |
| Hybrid sequential | 300 | 0.1 | 0.3 | 0.4 | 100 | 1 |

Infrared Analysis

Particle formation in the capacitive plasma could be observed in-situ with FTIR spectroscopy [33]. The decomposition products of TEOS in the predominantly oxygen plasma were $CO_2$ (2300 $cm^{-1}$), CO (2200 $cm^{-1}$), HCOOH (1776 $cm^{-1}$), CH4 (2900 $cm^{-1}$) and H2O or OH (3500-4000 $cm^{-1}$ and 1500-2000 $cm^{-1}$), and residual TEOS (1000-1250 $cm^{-1}$). The transversal optical (T.O.) vibrational mode corresponding to solid SiO2 could also be identified at (1066 $cm^{-1}$). By switching the precursor gas flow off and keeping the plasma discharge on, particles could be trapped a region close to the sheath above the powered electrode. It was found that particles could be trapped for an indefinite time period in the argon discharge. The solid $SiO_2$ IR peak could be verified by comparison with an IR absorption spectrum taken of particles collected after deposition. The calculated extinction of the infrared beam resulting from either bulk or surface absorptions was simulated for $SiO_2$ and SiO. It was found that the measured particle peak shows most similarity to the bulk and surface $SiO_2$ synthetic peaks. XPS measurements taken of particles collected from after the experiment showed the particle composition to be almost that of bulk $SiO_2$ at 32.5% Si, 67.5% O and 0.4% C, which gives O/Si of 2.1 and 0.4% carbon impurity. Particles trapped due to the high electric field in the sheath region above the powered electrode were monitored with the FTIR spectrometer. By monitoring the solid-state $SiO_2$ peak, the growth, trapping and loss of particles from the plasma as a function of time was observed. It was found that during particle nucleation, the $SiO_2$ peak increases sharply and reaches a maximum two minutes after the precursor flows are directed into the reactor. The TEOS signal increased less rapidly during particle nucleation as the TEOS was being consumed in particle formation and growth reactions. After 2 minutes the first particles grew large enough to leave the plasma glow and an equilibrium was reached between particle formation/growth and particles dropping out of the infrared beam and onto the substrate. At four minutes the precursors flows were switched off and only argon was dosed into the discharge. A drop in the $SiO_2$ absorption peak at this point was found to indicate loss of some particles from the plasma sheath. On switching the precursors flows off, the plasma conditions changed from that of an electro-negative discharge caused by the $O_2$ with low $n_e$ caused by the TEOS to an electro positive with higher $n_e$. This particle loss was attributed to a change in the plasma conditions as argon gradually replaced the precursor gases (possibly a result of higher ion drag).

Physical Characterisation of Particles

Thermal gravimetric analysis (TGA) measurement was performed by placing a sample of known mass in an oven and monitoring variations in the sample mass under either inert (Ar or $N_2$) or oxidizing ($O_2$ or $O_2/N_2$) atmospheres. In addition to monitoring variation in sample mass, monitoring the energy absorbed by the sample at different temperatures was taken to indicate variation in the material structure. Results from TGA can help predict how a material will react during post deposition plasma or thermal processing as is typically encountered when integrating a new material into semiconductor process. TGA was performed on particles collected after film deposition in both pure $N_2$ and 20% $O_2$ in $N_2$ atmospheres, using a temperature ramp rate set to 5° C./minute. Both measurements indicate the particles to be thermally stable up until temperatures in excess of 800° C. A 14% weight loss was observed for both measurements indicating no further oxidation of the particles took place in the oxidising atmosphere. A positive gradient in the temperature differential is indicative of exothermic reactions within the sample, and a negative gradient indicates endothermic chemical changes. The initial positive gradient is rather confusing as it suggests an exothermic reaction is occurring during the initial heat up. A possible explanation is that during this period any Si—OH groups in the sample might react to liberate water and form SiO$_2$. The evaporation of water from the sample would be an endothermic process, but the overall formation of SiO$_2$ and H$_2$O would be exothermic. The sample showed no signs of blackening or decomposition after TGA measurements, again indicating that the plasma produced particles were very stable.

The synthesis and trapping of particles from a TEOS/O$_2$ gas mixture was successfully demonstrated using a capacitively coupled discharge. The high thermal stability suggested by TGA, coupled with the dominance of Si—O groups in the infrared suggests the particles are silica-like. Moreover the particles are highly porous. Porosity is known to exist in plasma deposited films deposited from siloxane precursors such as TEOS and HMDSO and high bias potential are used to increase film density. The particles however, are formed from negative ions trapped in the plasma glow and the sheath surrounding them, and hence the energy of ions impinging on them is low relative to the sheath region above the electrode. As the formation of dense fully oxidized SiO$_2$ networks requires high energy input, the energy is not available to form dense particles. Particles collected post-deposition were found to coagulate into extremely light structures that are easily affected by electrostatic forces. Small angle x-ray diffraction (SAXS) measurements further show no long range order within the particle structure. These observations indicate that the particles consist of a porous SiO$_2$ network. Particle number density and size could be estimated from in situ absorption FTIR measurements. The controlled incorporation of porosity is interesting for low dielectric constant materials.

Two observations relating to reactor design were identified. Firstly a stagnation point in the current reactor geometry prevents homogeneous distribution of particles throughout a growing CVD layer. Secondly, the use of two separate plasma sources provides for the simultaneous synthesis of an SiO$_2$ and silicone layer as the two chemistries can be separately controlled.

Low-k Film Synthesis

Low-k films were synthesized using the combination of both the upstream (Zone I) and downstream (Zone II) plasmas. TEOS (tetraethoxysilane) was dosed using a Bronkhorst Hi-Tec CEM (Controlled Evaporation and Mixing) system (Bronkhorst, Ruurlo, The Netherlands) and combined with O$_2$ and Ar flows in the heated gas lines (80° C.) and then fed into the upstream plasma. TMSE (1,2-bis[trimethylsilyloxy] ethane) was dosed using a bubbler system using Ar as a carrier gas and fed via heated gas lines (80° C.), into the downstream plasma.

Figure 8:
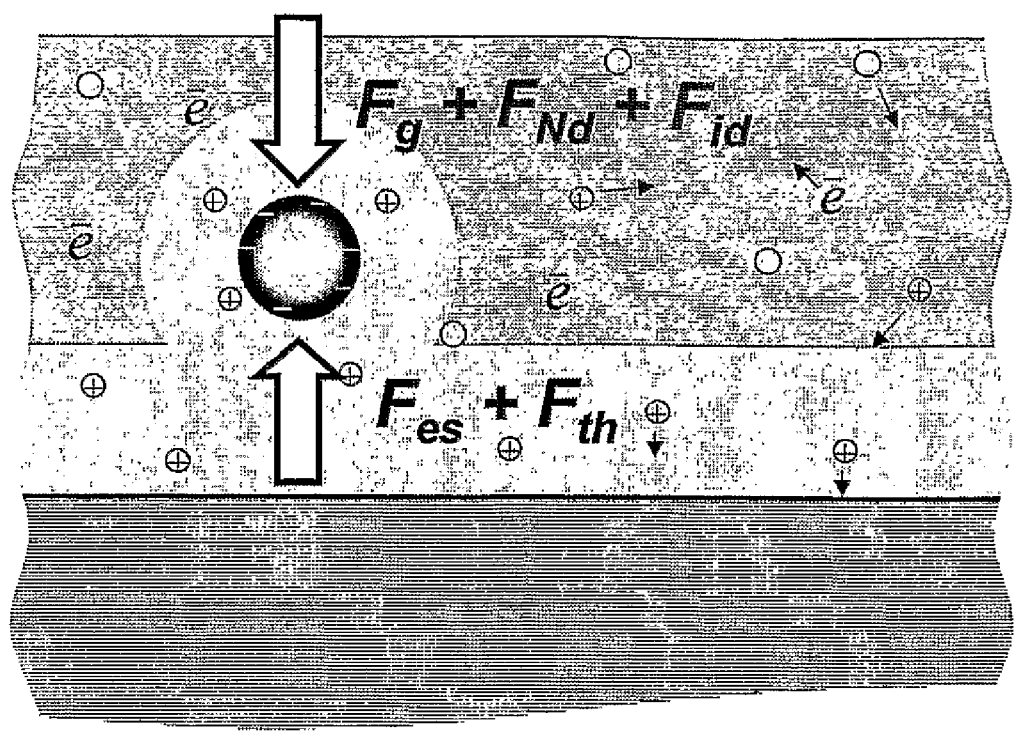
FIG. 8 shows a pictorial representation of forces acting on trapped particles. $F_g$ is the gravitational force, $F_{nd}$ and $F_{id}$ the neutral and ion drag forces, $F_{es}$ the electrostatic force and $F_{th}$ the thermophoretic force, as explained in Example 2

The injection of oxygen during the synthesis of the plasma polymer layer causes the layer to become more glass like and, consequently the adhesion to decrease. It is therefore necessary to ensure that all of the oxygen is consumed in the particle forming plasma where TEOS and oxygen are injected. In order to study this, optical emission spectroscopy was performed by using an Ocean Optics USB-2000 spectrometer with a spectral range of between 280 to 800 mm and resolution of approximately 1 nm. Light from the reactor was fed into the optical emission spectroscopy (OES) spectrometer via an optical fiber. The concentration of O atoms in an Ar/O$_2$ plasma was monitored under various conditions using OES and an approach reported by Han et al. [31] and Lieberman [32]. This study indicated that 0.05 TEOS mole fraction injected into the 0.5 O$_2$ mole fraction discharge (c.f. FIG. 8). The flow and conditions for the experiments presented herein are listed in Table 26.

TABLE 2

Experimental conditions for particle synthesis of nanocomposite films.

| Objective | Top Plasma [W] | Bottom Plasma [W] | TEOS [sccm] | O$_2$ [sccm] | TMSE [sccm] | Total Flow [sccm] | Pressure [Torr] |
|---|---|---|---|---|---|---|---|
| Oxygen depletion study | 0-200 | 0-400 | 0-30 | 0-50 | — | 100 | 1 |
| Low-k materials | 200-400 | 100-400 | 10-35 | 50 | 10-20 | 200 | 1 |

The plasmas were modulated with on and off times of 475 ms and 25 ms respectively to prevent particle trapping in the upstream plasma and above the substrate. When operating at 200 W, a self-bias potential of 150 V was observed to develop on the substrate table. Depositions were performed using a deposition time of 5 minutes resulting in film thicknesses ranging from 0.88 to 2.04 µm depending on the precursor flows and discharge power. Film thicknesses were determined using a Tencor P-10 surface profiler with an estimated accuracy of approximately ±10 nm. Boron doped silicon wafers with a resistivity of between 7 and 21 ohm cm were placed in the centre of the r.f. biased substrate table and used as substrates for determining the dielectric constants. All substrates were used as delivered and no attempt was made to clean or remove the native oxide.

The dielectric constants are determined from measurements of the materials capacitance using two independent methods described in Section on Dielectric Constant Determination hereinbelow.

Figure 3:
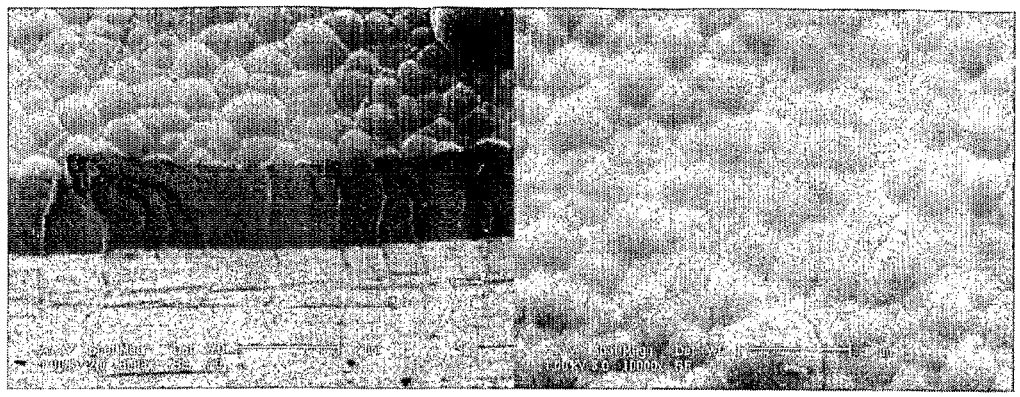
FIG. 3 shows an Environmental Scanning Electron Microscope (ESEM) image of a nanocomposite layer produced by a method of the invention.

A variety of deposition conditions were used to deposit the low-k layers with deposition rates varying from 3.0 to 6.8 nm/s. Increasing the TEOS and oxygen flows to the top plasma resulted in hazy coatings exhibiting high surface roughness as shown in the ESEM image in FIG. 3. The haze and high surface roughness observed was attributed to the increased synthesis and incorporation of particles and particle clusters into the growing TMSE layers.

Figure 4:
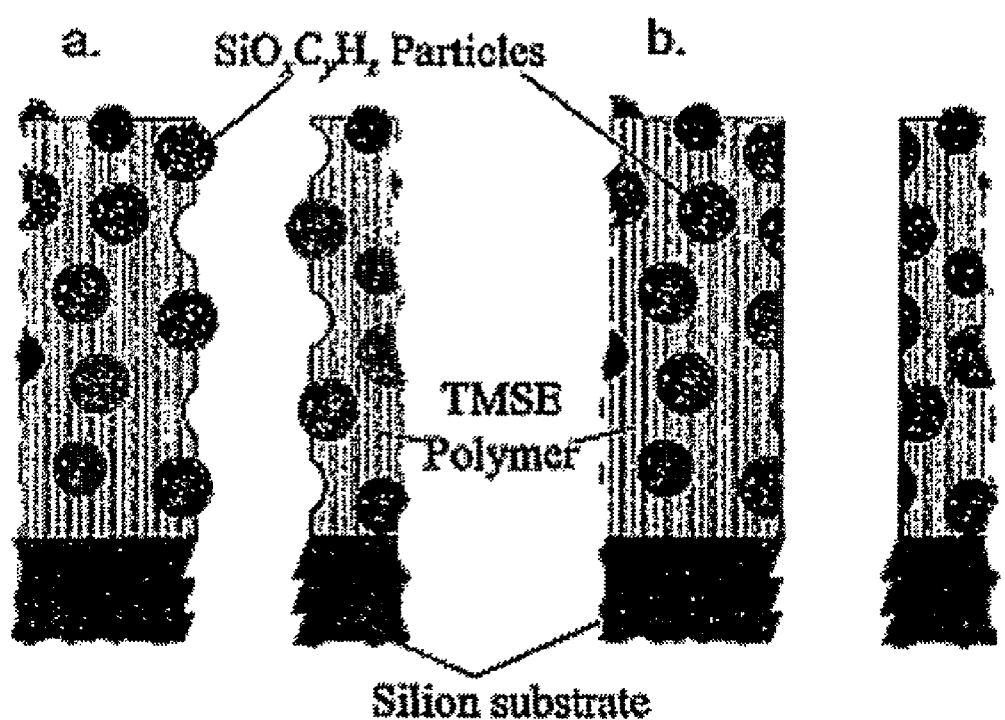
FIG. 4 shows a schematic of particles encapsulated in plasma polymerized (pp)-TMSE layer. a: strong particles bonding to pp-TMSE severed curing cleavage; b: weak particles.

Some of the samples were cleaved and cross sectional ESEM images taken in an attempt to identify the individual particles inside the TMSE layer however, no particles could be seen. The absence of particles in the cross sectional ESEM images suggests that the particle are mechanically weak and the structure is rot that of dense silicate. If the particles are dense and the intermolecular Si—O bonds within the particle are strong, then the particles should rot break and would therefore be visible in the cross sectional SEM image. However, the absence of particles in the cross sectional ESEM image suggests the particles break apart internally instead of separating from the coating. This process is depicted schematically in FIG. 4.

Dielectric Constant

Figure 5:
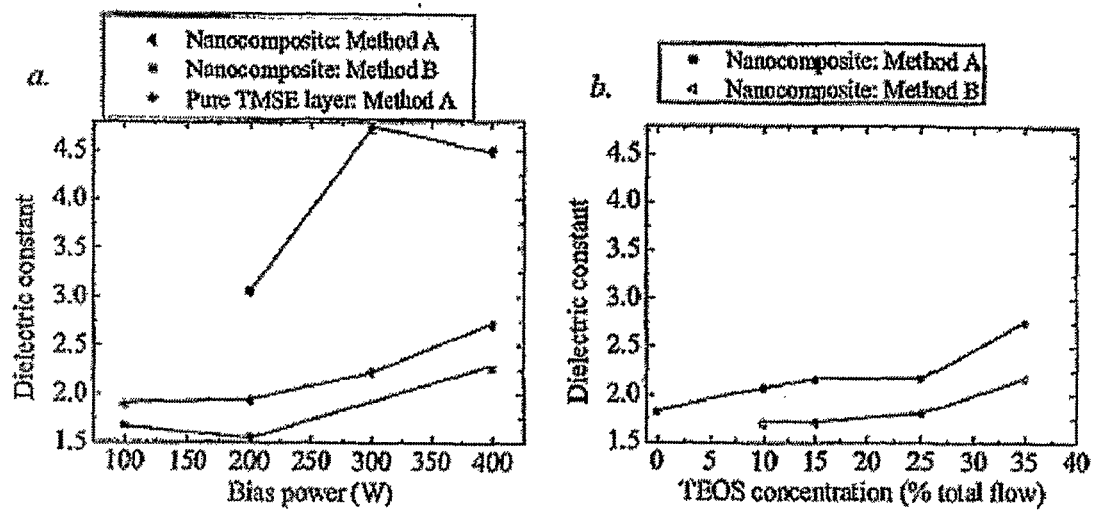
FIG. 5 shows the dielectric constant as a function of a: substrate bias and b: oxygen concentration added to particle synthesis plasma for the device in FIG. 1, as described in the Examples below.
Figure 6:
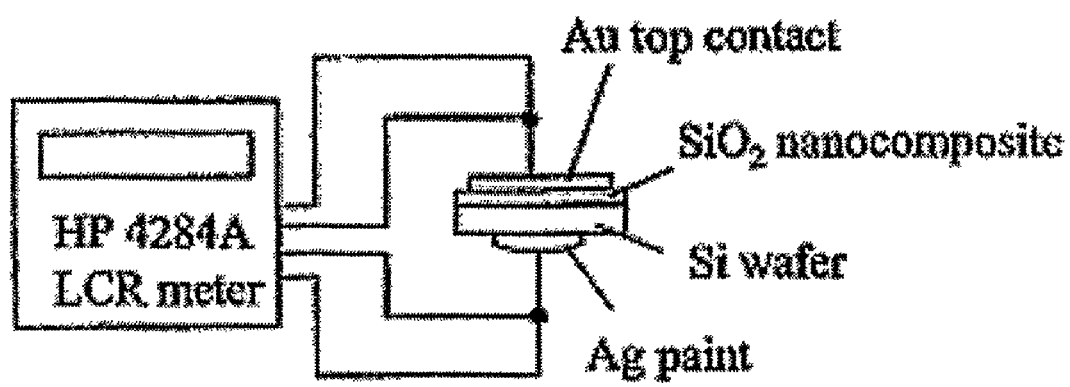
FIG. 6 shows the circuit setup for determining the dielectric constant using Method A as described in the Examples below.
Figure 7:
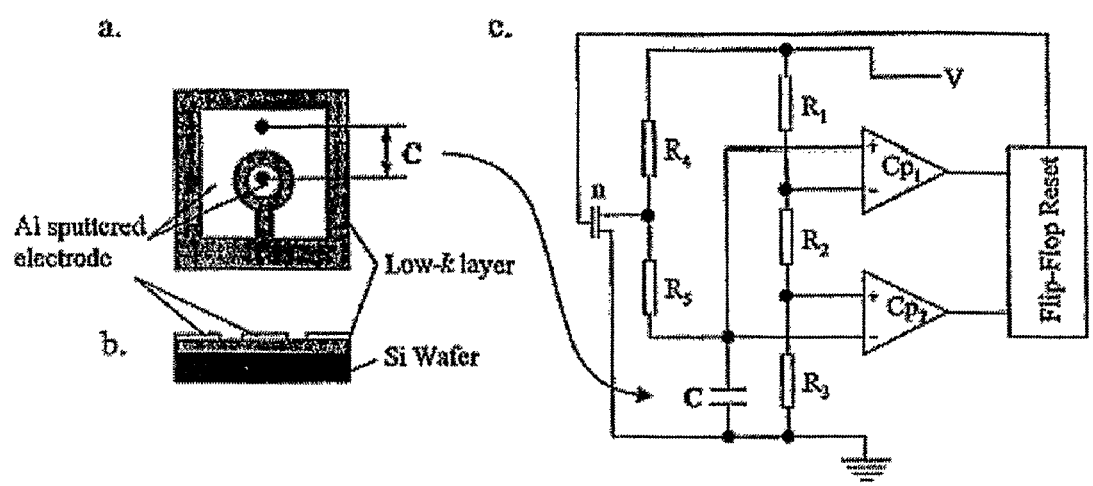
FIG. 7 shows Method B for determining the dielectric constants as described in the Examples below. a) plan view of sample; b) cross sectional sample view showing Al layer, dielectric material and Si wafer, and c) resonance circuit.

The dielectric constant of a material is affected by the material composition and porosity as discussed in the introduction to this chapter. The influence of both these phenomena on the dielectric constant can be seen in FIG. 5. Increasing the r.f. bias potential. (FIG. 5a) is known to enhance film density by increasing the energy of ions bombarding the film surface. The subsequent drop in porosity caused the dielectric constant to increase. Films deposited under identical conditions both without the TEOS/$O_2$ particle plasma (FIG. 5a) exhibit much higher k values indicating that the lower k values observed for the nanocomposite films is indeed due to the incorporation of porous particles.

The effect of film composition on the dielectric constant is such that at low oxygen concentrations silicone-like particles are produced retaining some of the organic functionality of the original TEOS precursor. As the oxygen concentration in the particle-forming plasma increases, so does the inorganic nature of the particles. Inorganic materials are characterised by polar bonding, this increases the concentration of permanent dipoles present in the film.

Identical trends in k as a function of bias power and TEOS concentration are observed independent of the technique used to measure k. A critical assessment of the two techniques used, showed Method A to yield the most reliable results (cf. Section on Dielectric Constant Determination).

The successful synthesis of nanometer sized silica/silicone particles from a TEOS/$O_2$ plasma, and subsequent incorporation into plasma polymerised TMSE layers was demonstrated. Thin films exhibiting low dielectric constants (values as low as 1.82±0.02 are obtained as measured using Method A) were deposited. The dielectric constant increased with increasing oxygen added to the particle plasma, and increasing r.f. bias applied to the substrate table. This is believed to be due to an increase in the SiOH content of the particles, and the subsequent increase in the dielectric constant is therefore attributed to increased polarity of the layer. Increasing the power applied to the substrate table increases the bias potential above the substrate and the resulting increase in ion energy causes film densification. The consequent reduction in film-porosity leads to an increase in the dielectric constant at high bias powers.

Dielectric Constant Determination

Method A: 1 $cm^2$ samples are prepared from the Si substrate and sputtered with a 60 nm gold front contact layer. Silver paint is applied to the backside of the sample to ensure a good electrical contact to the silicon wafer. The sample is then mounted between two contacts and connected to the Hewlett Packard 4284A Precision LCR meter (20 Hz to 1 MHz) (FIG. 10) and the capacitance measured at 1 kHz and 1 MHz oscillating potentials of 50 and 100 mV.

Method B: A contact pattern of aluminium is sputtered onto the top of the sample as shown in FIGS. 11a and 11b. The sample is then placed into an oscillating circuit consisting of two comparators and a flip-flop reset switch (FIG. 11c). The negative and positive inputs of comparators one and two ($Cp_1-$ and $Cp_2+$) are set at ⅓ and ⅔ the line voltage respectively, by $R_2$. The other two comparator inputs ($C_1+$ and $Cp_2-$) are charge via resistors $R_4$ and $R_5$ until the comparator outputs switch and the flip-flop and transistor grounds the comparator inputs ($Cp_1+$ and $Cp_2-$) and resets the circuit.

For the ideal case, the overall capacitance (CT) relates to the circuit frequency (f), $$C_T = \frac{1.44}{(R_4 + R_5)f} \quad (1)$$

The sample preparation technique used in Method B actually generates two series capacitances within the sample, $C_1$ and $C_2$ [in sample capacitance, F]. The relative contribution to the overall capacitance ($C_T$) scales with the respective areas A1 and A2 [$m^2$] as described in Eq. (2).

$$C_T = \left(\frac{1}{C_1} + \frac{1}{C_2}\right)^{-1} \quad (2)$$
$$= \left(\frac{1}{\varepsilon_0\varepsilon_r\frac{A_1}{d}} + \frac{1}{\varepsilon_0\varepsilon_r\frac{A_2}{d}}\right)^{-1}$$
$$= \frac{\varepsilon_0\varepsilon_r}{D}\left(\frac{1}{A_1} + \frac{1}{A_2}\right)^{-1}$$

where d is the thickness of the dielectric layer [m] with permittivity $\in_r$, and $\in_0$ is the permittivity of free space [$Fm^{-1}$].

The oscillating frequency is determined by $R_4$, $R_5$ and C. The presence of internal and parasitic capacitance are accounted for by calibrating the circuit resonant frequencies with a series of fixed capacitors (1% tolerance).

For both measurement techniques, the dielectric constant k is determined from the capacitance by, $$k = \frac{Cd}{\varepsilon_0 A} \quad (3)$$

where C is the sample capacitance in [F].

Errors in the dielectric constant measurements are predominantly caused by the uncertainty in the film thickness and uniformity and are estimated to be approximately 2-6%. Method B is likely to be less reliable than A for several reasons namely, 1. The circuitry is not mounted in any form of enclosure and hence not protected from surrounding environmental influences (electromagnetic interference, moisture and mechanical vibrations).

2. No subsidiary circuitry is included to compensate temperature variations or fluctuations in the power supply.

3. Each sample is effectively measured at a different voltage frequency as the circuit resonance depends on the capacitance of the sample.

Example 2

In this Example the synthesis, monitoring and characterisation of nanoparticles and their incorporation into low dielectric constant layers using the dual capacitive plasma reactor is described in more detail.

Introduction

In deposition systems used in the semiconductor and micro electronic industries, particle production is an undesirable by-product of some plasma processing steps. Device failure as a result of dust contamination is a familiar issue and has prompted research into particle formation and transport mechanisms in the hope that it might be avoided. A prominent area of literature regarding particle contamination deals with silane chemistries due to its widespread application in industrial processes. Although particles have been observed in TEOS and HMDSO plasma discharges, very little has been done in elucidating the mechanism by which they are formed. This is perhaps partly due to the added complexity of these gas mixtures brought on with the addition of the carbon chemistry.

Fujimoto et al. [Fujimoto T., Okuyama K., Yamada S., Adachi M., J. Appl. Phys., 85, 4196-4206, (1999)] investigated particulate formation from four siloxane precursors (triethoxysilane, tetramethylorthosilicate, octamethyl-cyclotetrasiloxane and TEOS) in an atmospheric pressure, thermally activated CVD process and determined Arrhenius type activation energies ($E_a$) for the overall conversion of precursor into particle. As no consideration for thermal or fluid dynamical effects were taken the precise values for the activation energies reported should be taken with care. Their work did however suggest that TEOS, with the lowest overall reaction activation energy, would most readily form particles. Before particles can be synthesized and incorporated into growing silicone layers, an understanding of particle formation and transport processes in CVD reactors is required.

Particle Formation in r.f. Discharges

Two prominent mechanisms have been proposed to explain the manifestation of particles in low pressure discharges. At pressures typical for plasma processing the cross sections for chemical reactions between neutral species are too low to explain the plethora of particles found. Reaction cross sections are several orders of magnitude higher for ions, but positive ions are easily lost to the vessel walls where they either react to form a coating or pick up an electron and neutralise. Research into $SiH_4$ plasmas has revealed that negatively charged ions can be formed in some gases and, being repelled by the opposing potential in the sheath at the reactor walls, become trapped in the discharge. Negative ions are predominantly the product dissociative attachment processes where electron impact dissociates a neutral species to form a neutral species and a negative ion. Trapped negative ions act as nucleation centers for homogeneous particle growth. The high electro-negativity of fluorine and oxygen, causing high negative ion concentrations, are believed to be responsible for particle production in etch processes. The presence of negative ions also affects the plasma properties and causes them to differ from those of electropositive plasmas as formed from noble gases such as argon. The loss of electron density through electron attachment processes drives the electron temperature up in order to sustain the ionization rate. At high negative ion concentration (sometimes a factor of ten higher then $n_e$) most of the negative charge is carried by the negative ions and the sheath potential drops, and as the current is still carried by the electrons, the plasma becomes more resistive.

Particles have also been observed in plasma systems where no reactive or electronegative gases have been introduced. In these systems, particles are thought to be ejected from the reactor wall as a result of ion bombardment. Once ejected particles rapidly attain negative charge from the plasma glow and become trapped. Suh et al. [Suh S.-M., Zachariah M. R., Girshick S. L., J. Vac. Sci. Technol. A, 19, 940-951, (2001)] proposed a more extensive mechanism and devised a model for cluster formation up to $(SiO_2)_{10}$ from $SiH_4$ and $O_2$ gas mixtures using quantum chemical theory. Assuming clusters containing more than ten silicon atoms $(SiO_2)_{10}$ were irreversibly formed and that the nucleation and initial growth of these species was very rapid, they modelled the nucleation and coagulation of particles. The model predicted a fall in particle concentration immediately after the initial nucleation period due to coagulation processes. Immediately after nucleation two mechanisms govern the particle growth rate, coalescence, where particle size increase at the expense of particle number density, and the arrival of growth precursors at the particle surface. Coalescence dominates particle growth immediately after nucleation as growth precursors are depleted. However, as particle numbers decrease and surface charge increases with particle size causing particle to repel on another, the arrival of growth precursors begins to dominate.

At a certain point growing clusters of molecules will reach a size where they begin to experience additional forces to those they experienced as a gas. This point has been proposed to be once a cluster consisted of ten Si atoms or more (for $SiO_2$ particles) or when a cluster reaches a radius of about 10 nm.

In order to achieve controlled synthesis and incorporation of these macroscopic particles into growing layers, it is therefore necessary to understand the forces acting on particles in a plasma discharge and how these forces vary depending on the particle dimensions and plasma parameters.

Forces on Particles

In the electrode configuration used in this study, the electrostatic force and thermophoretic force act to push the particles away from the r.f. electrode (cf. FIG. 8). These forces are counteracted by the ion and neutral drag ($F_{id}$, $F_{nd}$) and gravitational force ($F_g$) (see Eqs. (11) to (15)) that act to push the particle downwards towards the electrode (FIG. 8). The relative magnitude of these forces determines the position of the particles since all forces are a function of the position in the reactor.

Figure 9:
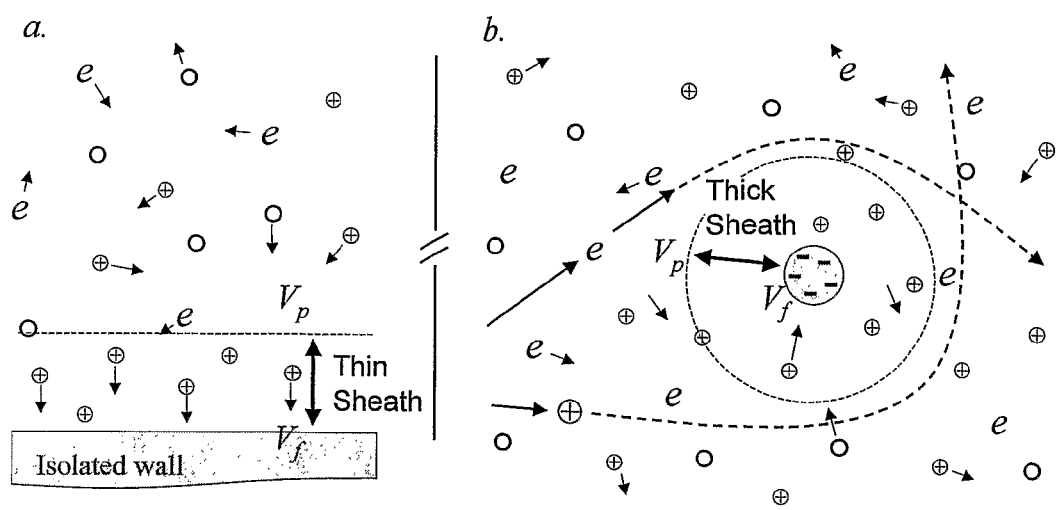
FIG. 9 shows in panel a) a thin sheath model where object is larger than sheath dimensions and therefore assumed to be planar and in panel b) a thick sheath model for small objects in the orbit motion limited (OML) regime, note that some of the electrons are not collected as exemplified in Example 2.

Child-Langmuir sheath theory states that the steady state positive ion and electron flux to the surface of an insolated body suspended in a plasma has to be equal. To maintain equal electron and ion fluxes, the body gains a negative charge and becomes surrounded by a sheath of positive space charge (see FIG. 9).

For a particle with radius (a) greater than the Debye length ($\lambda_D$) the thin or planar sheath model is used (FIG. 9a). In the model, ions entering the sheath are assumed to have been accelerated to the Bohm velocity in a pre-sheath region and, assuming a Maxwellian energy distribution function, the potential at the body surface ($V_f$) with respect to the bulk plasma ($V_p$) is, $$V_f - V_p = -\frac{k_B T_e}{2e}\left[\ln\left(\frac{m_i}{2\pi m_e}\right) + 1\right] \quad (4)$$

where $m_i$ and $m_e$ are the ion and electron mass and ions are first accelerated by $½ k_B T_e/e$ in the pre-sheath region to the Bohm velocity. For argon this gives $V_f - V_p = -5.2$ ($k_B T_e/e$), and hence for $T_e = 1$ to 3 eV gives $V_f - V_p = -5.2$ to $-15.6$ V. A full derivation of the planar sheath model is treated in standard texts [*Introduction to Plasma Physics and Controlled Fusion*, Vol., *I* Chen F. F., Plenum Press, New York, (1984); *Fundamentals of Plasma Physics*, Bittencourt J. A., Pergamon Press, Oxford, (1986)]. For very small particles however ($\lambda_D \gg a$) not all incident ions are collected by the particle and Orbit Motion Limited Theory (OML) is needed. This is pictorially represented in FIG. 9b.

Using OML theory the ion current $I_i$ (assuming Maxwellian ion distribution) and electron current $I_e$ (assuming Boltzmann distribution) to the particle surface are, $$I_i = \pi a^2 n_i e \left(\frac{8k_B T_i}{\pi m_i}\right)^{\frac{1}{2}}\left[1 - \frac{e(V_f(a) - V_p)}{k_B T_i}\right] \quad (5)$$

$$I_e = -\pi a^2 n_i e \left(\frac{8k_B T_e}{\pi m_e}\right)^{\frac{1}{2}} \exp\left[\frac{e(V_f(a) - V_p)}{k_B T_e}\right] \quad (6)$$

where $n_i$ is the ion density in the plasma bulk, $T_i$, the ion temperature, $k_B$ the Boltzman constant and $V_f(a)$ the potential of the particle. At steady state $I_e = I_i$ hence, $$\exp\left[\frac{e(V_f(a) - V_p)}{k_B T_e}\right] = \left(\frac{T_i m_e}{T_e m_i}\right)^{\frac{1}{2}}\left[1 - \frac{e(V_f(a) - V_p)}{k_B T_i}\right] \quad (7)$$

The normalized floating potential $[e(V_f(\alpha) - V_p)/k_B T_e]$ depends only on the electron to ion mass and temperature ratios. The numerical solution for $e(V_f(\alpha) - V_p)/k_B T_e$ (Equation 7) as a function of $T_i/T_e$ for Ar ions is plotted in FIG. 10.

Figure 10:
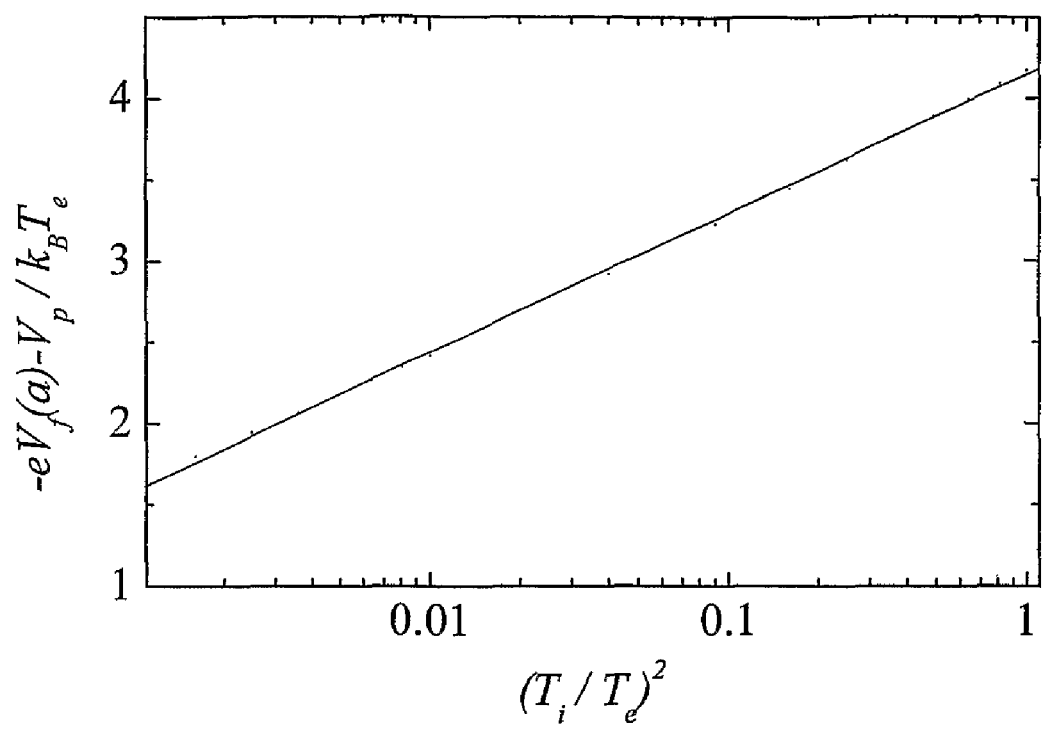
FIG. 10 shows the particle potential as a function of the ion/electron temperature ratio calculated for an ion mass of 40 (Ar) in the experiment of Example 2.

From FIG. 10 it can be observed that the potential $V_f - V_p$ at the particle surface (for a specific ion mass) depends only on the relative temperature of the ions and electrons and the particle radius.

Using the fit parameters form FIG. 10, the potential of the dust particle can be calculated (Eq. (7)), assuming the particle is isolated and has spherical geometry. The number of charge carriers is then calculated from the capacitance, $$C = \frac{Q}{V_f - V_p} = \frac{Z_D e}{V_f - V_p} = 4\pi\varepsilon_0 a \quad (8)$$

where $\varepsilon_0$ is the permittivity of free space, Q the value of the particle charge and $Z_D$ the number of charge carriers (electrons) on the surface of the particle. Applying OML theory to a typical capacitively coupled plasma with an electron temperature of 3 eV, a density of $10^{15}$ m$^{-3}$ and neutral gas temperature of 398 K, gives a particle potential of approximately −7.4 V, which is lower than that derived from the planar sheath model under the same conditions. The electrostatic force ($F_{es}$) acting on a particle is then, $$F_{es} = QE = Z_D eE \quad (9)$$

with E is the electric field vector that points from the bulk plasma towards the powered electrode. The magnitude of E can be very large in a parallel plate reactor configuration as the electrode typically reaches a self bias potential of several tens of volts and is separated from the bulk plasma by a sheath which is typically a few millimeters thick. The resulting electric field is then several tens of thousands of volts per meter as was shown in a recent study of the electric field in an r.f. discharge using fluorescence dip spectroscopy where fields as high as $10^5$ V/m were measured [Takizawa K., Sasaki K., Kono A., Appl. Phys. Lett., 84, 185-187, (2004)].

In addition to the electrostatic force, positively charged ions traveling from the plasma bulk towards the electrode can also collide with the dust particles (see FIG. 8). This induces an ion drag ($F_{id}$) force that acts to push the particles towards the electrode. The ions pick up energy as they are accelerated through the sheath and some of this energy is converted into heat when the ions collide with the electrode. Heating of the electrode via ion bombardment produces a temperature gradient and a consequent thermophoretic force ($F_{th}$) that acts to push particles away from the hot electrode. This assumes that gas heating occurs via collisions with the hot electrode and that heating of neutral species through interaction with charged particles is negligible. The thermophoretic and ion drag forces are calculated using Eqs. (10) and (11) respectively.

$$F_{th} = -\frac{32}{15}\frac{a^2}{v_{th,n}}\left[1 + \frac{5\pi}{32}(1 - \alpha)\right]\kappa_T \nabla T_n \quad (10)$$

$$F_{id} = F_{id}^O + F_{id}^C \quad (11)$$

$$\approx a^2\left[\frac{eV_f(a) - V_p}{k_B T_e}\right]^2 n_i k_B T_e \ln\left(1 + \frac{61.32}{\beta^2}\right) + a^2 n_\infty k_B T_e\left[1 + \frac{eV_f(a) - V_p}{k_B T_e}\right]^2$$

where $\kappa_T$ is the translational part of the thermal conductivity of the gas, $n_i$ is the density of the unperturbed plasma, $v_{th,n}$ the thermal velocity and $T_n$ the temperature of the neutral gas. The parameter $\beta$ is calculated assuming the ion velocity $v_i$ is equal to the Bohm velocity using Eq. (12), $$\beta = \frac{Z_D e^2}{4\pi\varepsilon_0\left(\frac{1}{2}m v_i^2\right)\lambda_D} \quad (12)$$

In addition to the electrostatic, ion drag and thermophoretic forces, the gas flow also produces a neutral drag force ($F_{nd}$), and as the particles have mass they will experience a gravitational force $F_g$ (cf. FIG. 8). These forces are expressed as, $$F_g = \frac{4}{3}\pi a^3 \rho_p g \quad (13)$$

$$F_{nd} = -\frac{\pi}{2}a^2 m_n n_n v_{th,n} H(s)(v_D - v_n) \quad (14)$$

where H(s) is a function of s only and is defined by, $$H(s) = \frac{1}{s}\left[\left(s + \frac{1}{2s}\right)\exp(-s^2) + \sqrt{\pi}\left(s^2 + 1 - \frac{1}{4s^2}\right)\mathrm{erf}(s)\right] \quad (15)$$

and s is the ratio, $$s = \frac{|v_D - v_n|}{v_{th,n}}\frac{2}{\sqrt{\pi}} \quad (16)$$

$\rho_p$ is the particle density, g the gravitational constant, $M_n$ the mass, $n_n$ the number density of the neutrals and erf(s) the error function of s. $v_D$ and $v_n$ represent the mean velocity of the dust particle and gas flow respectively. $F_{nd}$ is calculated assuming the 'kinetic' or long mean free path' regime. This regime is established by a high value of the Knudsen number $K_n$ which is defined as the ratio of the mean free path of the neutral gas molecules to the dust particle radius ($K_n = \lambda_{m/p}/\alpha$). For low values of $K_n$ (high pressure hydrodynamic regime) the drag force can be obtained from the Stokes law and is proportional to the dust particle radius and velocity. For low pressure processes $\lambda_{mfp}$ is in the order of a few hundred micrometers and $\alpha$ is a few µm, $K_n$ is much larger than unity and the kinetic regime is chosen where the principles for the derivation of the neutral drag force are the same as those for the ion drag (see Eq. (11)). The gas velocity used for determining the magnitude of $F_{nd}$ was taken from a fluid dynamic model of the reactor. As the particle radius decreases the electrostatic force dominates pushing smaller particles to regions of low electric field (high plasma potential), usually situated in the centre of the plasma glow.

All of the forces depend on either the particle size/mass (as the density is assumed to be constant). The electrostatic and thermophoretic forces depend on $T_e$ and the temperature gradients inside the reactor respectively. The downwards forces $F_g$ and $F_{id}$ depend on the particle mass and plasma density ($n_e$) while the $F_{nd}$ depends on the gas pressure and velocity and acts in the direction of the flow.

Figure 11:
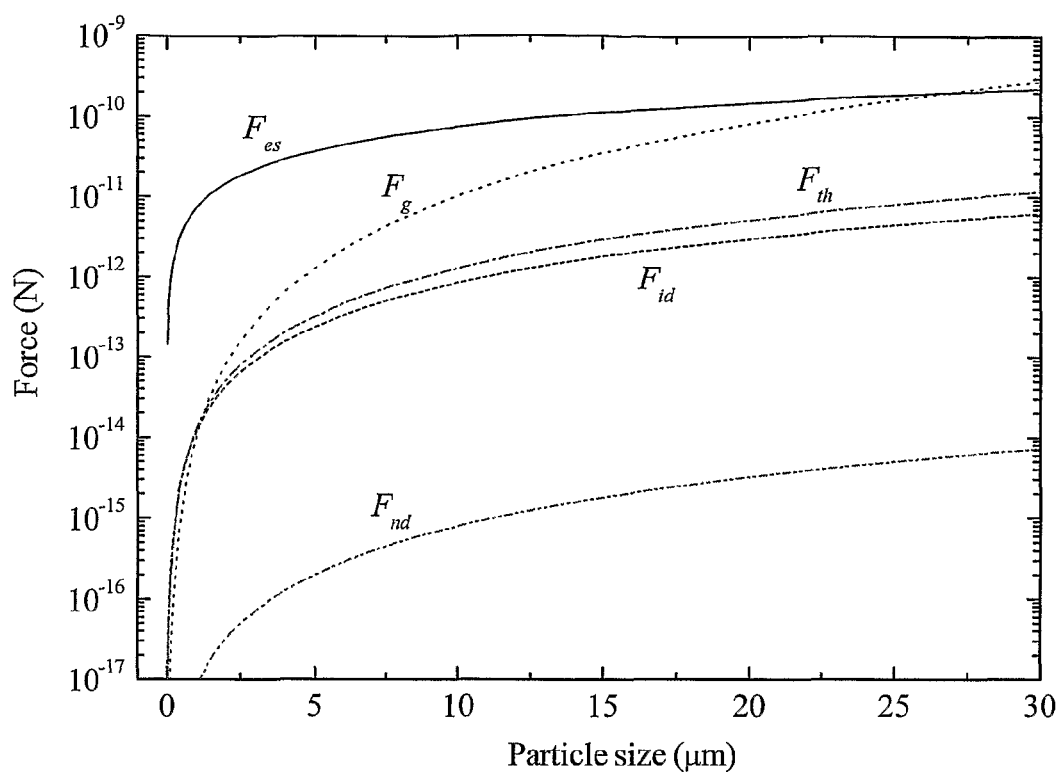
FIG. 11 shows calculated values for forces acting on dust particles trapped in an r.f. discharge. Fg is the gravitational force, Fnd and Fid the neutral and ion drag forces, Fes the electrostatic force and Fth the thermophoretic force in the experiment of Example 2.

The relative magnitude of these forces is plotted as a function of particle radius ($\alpha$) in FIG. 11. The electrostatic force has a linear dependence on the electric field, the magnitude of which varies greatly in the plasma. Bulk plasma is considered quasi-neutral and therefore the electric field in this region is relatively small. In the sheath regions however, large electric fields exist to confine the highly mobile electrons. In this Experiment, self biasing of the driven electrode plate was observed to reach 150 V during particle synthesis experiments. Assuming a neutral gas temperature of 400° K., $T_e$=3 eV and $n_e = 10^{15}$ m$^{-3}$ the sheath above the driven electrode is calculated to be 8.3 mm, which is within the experimentally observed estimation of between 5 to 10 mm (from the electrode surface to the beginning of the glow). This gives an electric field above the electrode of approximately 18000 V/m and consequently the electrostatic force, $F_{es}$ is calculated to be $7.4 \cdot 10^{-13}$ N for 100 nm particles. Under the same conditions, and assuming a bulk density of SiO$_2$ to be 2000 kg/m$^3$, the total force contribution from $F_g$ and $F_{id}$, is equal to $6.51 \times 10^{-16}$ N. The enormous electric field in the plasma sheath therefore represent an insurmountable barrier for the particles and so they become trapped between the plasma glow and the sheath edge.

Figure 12:
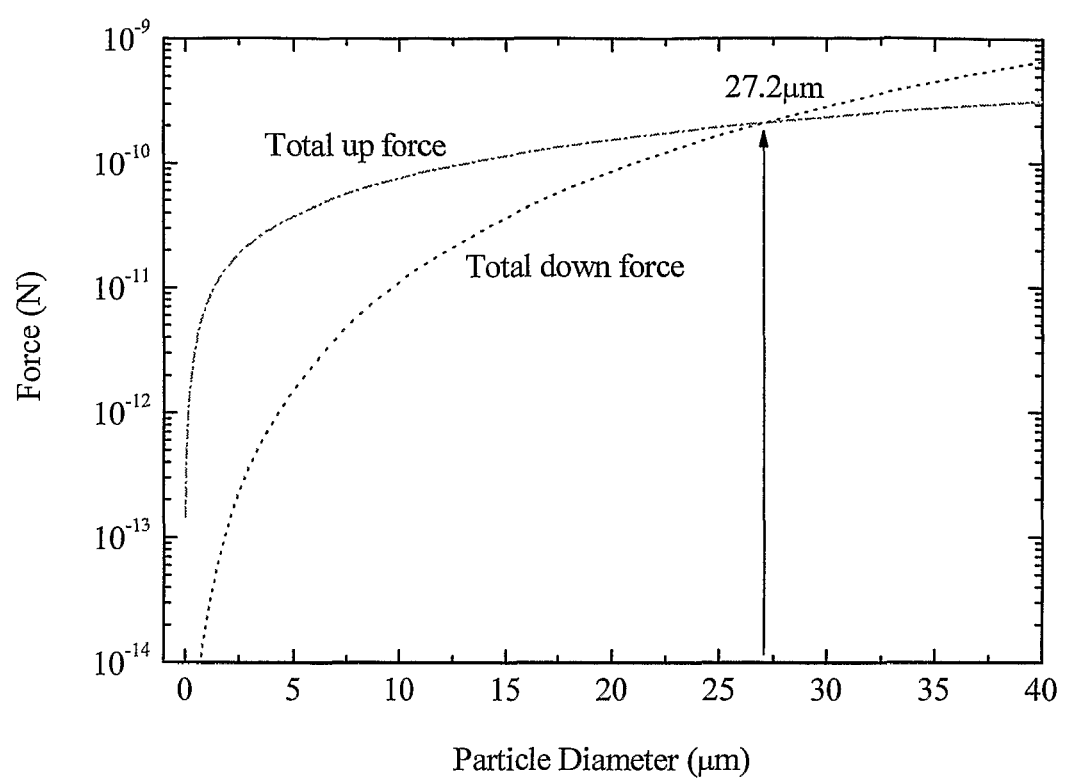
FIG. 12 shows the balance of forces in the experiment of Example 2 and indicate that particle with diameter greater than 27.2 µm will be expelled from the plasma.

The electrostatic force is the most dominant for small particles. As the particle radius increases the gravitational force begins to dominate and it is not until the particle diameter reaches 27.2 µm that the particle mass becomes large enough for the particle falls through the electrode sheath (FIG. 11). An overall balance of the 'up' and 'down' forces can be seen in FIG. 12.

However, particles considerably smaller than 27 µm are observed buried in heaps of particles observed to form on the electrode during plasma operation. During preliminary particle forming experiments several unusual structures were observed on the driven substrate table under certain flow conditions. As the total gas flow rate entering the reactor decreased, the distribution of particles inside the reactor varied. At relatively high flow rates (>200 sccm), particles were seen to heap in the centre of the electrode and form around the edges of the cage and conical inlet. At low flow rates (<56 sccm) particles accumulated in the centre of the electrode in the form of relatively large (3 cm) mushrooms.

The loss of particle charge as they enter the electrode sheath, and hence reduction of $F_{es}$, implies that the large electric field in this region is not responsible for confining the particles in the plasma. Assuming the electric field acting on the charged particles is just above the electrode sheath (where the particles are still immersed in the plasma), and that particles stop growing once the particle and electrode sheath start to combine. Balancing the up and down forces gives, $$F_{down} = F_{up} = F_g + F_{id} + F_{nd} = F_{es} + F_{th} = QE + F_{th} \quad (17)$$

therefore, $$F_g + F_{id} + F_{nd} - F_{th} = F_{es} = QE \quad (18)$$

re-arranging to give $$E = \frac{(F_g + F_{id} + F_{nd} - F_{th})}{Q} \quad (19)$$

Using Eqs (5) to (8), and a particle diameter of between 100 and 200 nm (taken from ESEM images of particles collected after experiments) the confining electric field, E, becomes between 3.72 and 1.65 V/m. This field strength is associated more with the plasma bulk than the sheath region, suggesting that the particles are trapped just above the electrode sheath.

The particles or particle clusters are experimentally observed to breach the sheath in the centre of the electrode to form "heaps" of particles on the substrate. An understanding of the forces on the particles, combined with a fluid model of the reactor geometry can explain the different particle deposits at different flow conditions. The position at which the particles accumulate at the center of the electrode and form heaps coincides with a stagnation point in a flow profile where Fnd is perpendicular to the electrode surface.

Experimental Setup

Figure 13:
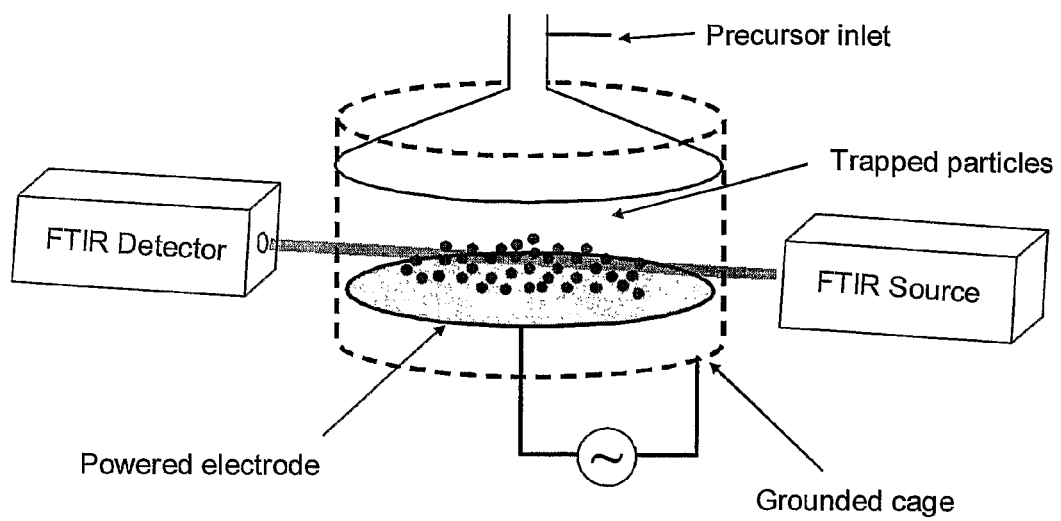
FIG. 13 shows a schematic of particle synthesis and trapping reactor with in-situ FTIR spectrometer as used in Example 2.

Particles were synthesized, trapped and monitored using a capacitively coupled r.f. discharge as shown in FIG. 13. The steel substrate table acts as the driven electrode and is surrounded by a grounded steel cage to contain the plasma. No cooling systems were implemented and the substrate typically reached a temperature of 100° C. during film growth or particle synthesis which typically lasted about 10 minutes.

Infrared spectroscopic measurements were done using a Midac M2500-C Fourier transform infrared spectrometer (FTIR) that consisted of two units. The detector unit housed the Mercury Cadmium Telluride (MCT) detector, while the source unit housed the Michelson interferometer and glow bar source. The two instrument units were positioned either side of the reactor and the infrared beam (Ø=2 cm) passed over the driven electrode clearing the substrate table by 3 mm. Spectra were recorded using a spectral resolution of 1 cm$^{-1}$ and averaging 10 consecutive scans to improve the signal-to-noise ratio. Infrared spectra were de-convoluted using the Peak Fit (Systat Software) and heights of absorbance features were used to monitor variation in species concentration.

The tetraethoxysilane precursor [CAS 78-10-4] 98% purity was evaporated and dosed using a Bronkhorst HiTec CEM system (Bronkhorst HiTec BV, Ruurlo, THe Netherlands) while argon and oxygen flows were controlled using Bronkhorst HiTec mass flow controllers. All gas lines to the reactor were heated to 80° C. to prevent condensation of the TEOS precursor. A MKS throttle valve located in the reactor exhaust system regulated the reactor pressure, which was constant during each experiment.

The key experiment to deposit hybrid films in which SiO$_2$-like particles are embedded in an organic matrix is as follows. Conditions from particle synthesis and trapping experiments were combined with conditions optimized for growing a-C:H layer. This was done by first synthesizing the particles, purging the precursor gases while holding the SiO$_2$ particles in the plasma sheath above the electrode and then injecting methane. The methane would deposit on the substrate and particle surfaces to form an amorphous carbon layer, in which the particles would hopefully become embedded. A summary of the experiments and process conditions are presented in Table 3.

TABLE 3

Experimental condition for particle synthesis and trapping experiments.

| Experiment | Power [Watt] | Fraction TEOS | Fraction $O_2$ | Fraction $CH_4$ | Flow [sccm] | Pressure [Torr] |
|---|---|---|---|---|---|---|
| Particle synthesis | 100-500 | 0.05-0.3 | 0-0.7 | 0 | 100-300 | 1 |
| Mushroom formation | 200-300 | 0.1-0.2 | 0.5 | 0 | 56 | 0.5-1 |
| Hybrid simultaneous | 300 | 0.2 | 0.5 | 0.2 | 200 | 1 |
| Hybrid sequential | 300 | 0.1 | 0.3 | 0.4 | 100 | 1 |

Infrared Analysis

Figure 14:
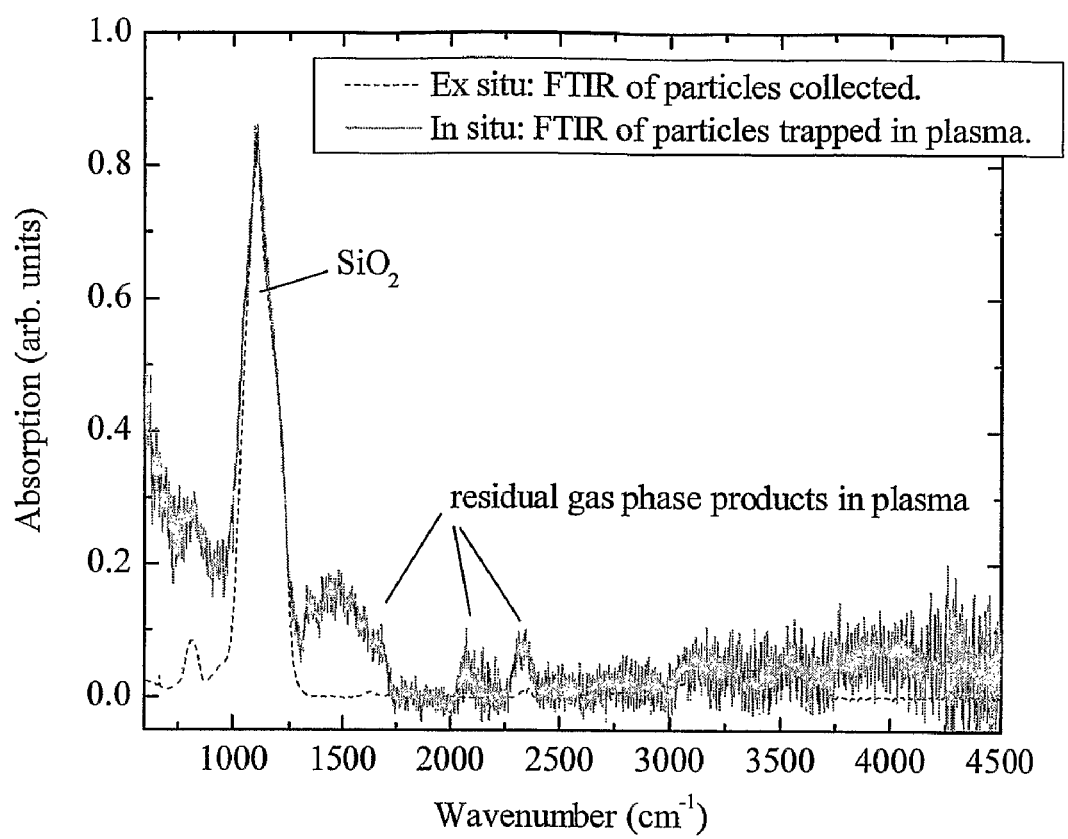
FIG. 14 shows a graphic comparison between FTIR spectra of particles trapped in a TEOS free plasma discharge and particles collected on a c-Si wafer afterwards as performed in Example 2.

Particle formation in the capacitive plasma could be observed in-situ with FTIR spectroscopy. The decomposition products of TEOS in the predominantly oxygen plasma were $CO_2$ (2300 cm$^{-1}$), CO (2200 cm$^{-1}$), HCOOH (1776 cm$^{-1}$), $CH_4$ (2900 cm$^{-1}$) and $H_2O$ or OH (3500-4000 cm$^{-1}$ and 1500-2000 cm$^{-1}$), and residual TEOS (1000-1250 cm$^{-1}$). The transversal optical (T.O.) vibrational mode corresponding to solid $SiO_2$ could also be identified at (1066 cm$^{-1}$). By switching the precursor gas flow off and keeping the plasma discharge on, particles could be trapped a region close to the sheath above the powered electrode. It was found that particles could be trapped for an indefinite time period in the argon discharge. The solid $SiO_2$ IR peak could be verified by comparison with an IR absorption spectrum taken of particles collected after the deposition experiment (FIG. 14).

Figure 15:
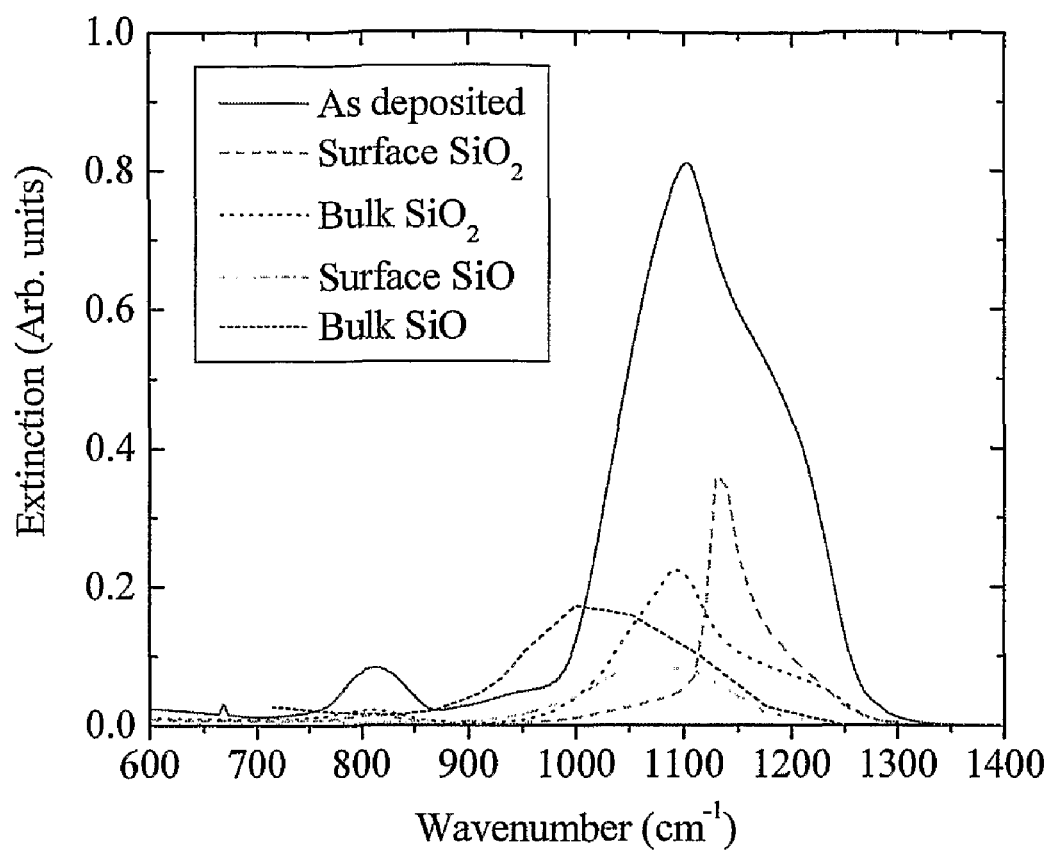
FIG. 15 shows a graphic comparison between calculated bulk and surface vibrations for SiO and SiO2 with measured IR spectra of particles synthesized as performed in Example 2.

The calculated extinction of the infrared beam resulting from either bulk or surface absorptions was simulated for $SiO_2$ and SiO, assuming spherical particles and optical constants obtained from the literature [*Handbook of optical constants of solids*, Palik E. D., Academic Press, London, (1998)], by application of the Beer-Lambert law, using Eqs. 20 to 25 and plotted as a function of wavelength in FIG. 15.

It can be seen that the measured particle peak shows most similarity to the bulk and surface $SiO_2$ synthetic peaks. XPS measurements taken of particles collected from after the experiment showed the particle composition to be almost that of bulk $SiO_2$ at 32.5% Si, 67.5% O and 0.4% C, which gives O/Si of 2.1 and 0.4% carbon impurity.

Figure 16:
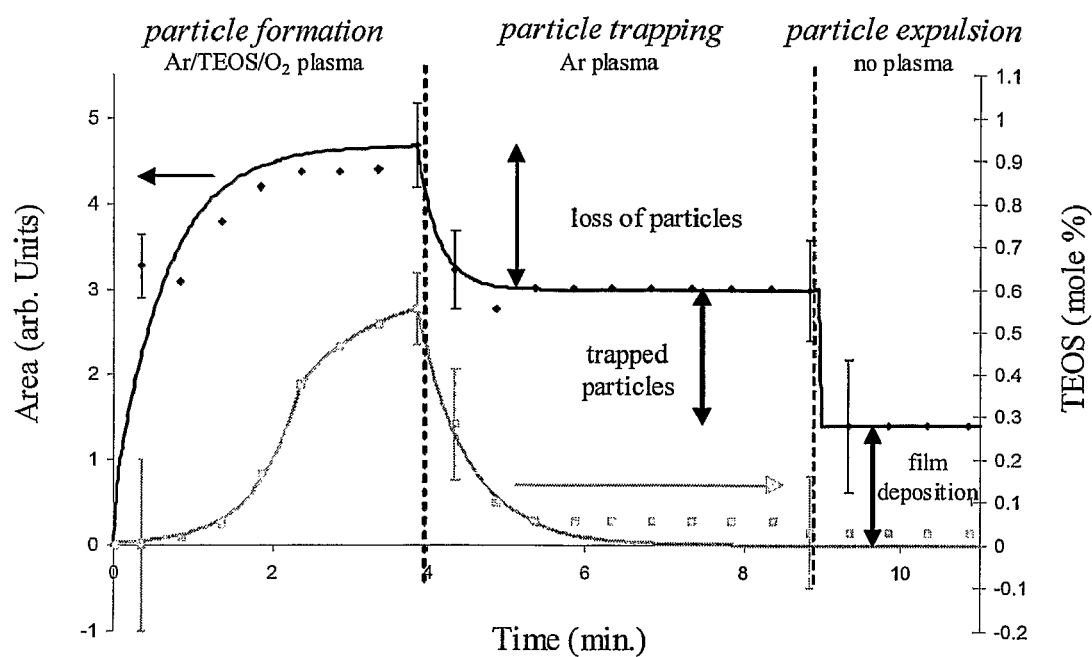
FIG. 16 shows a time dependent particle measurements of particle trapping using FTIR spectroscopy in a TEOS/O2 plasma in the experiment described in Example 2. Black line=silica paek (1066 wavenumber); grey line=TEOS (precursor) peak.

Particles trapped due to the high electric field in the sheath region above the powered electrode were monitored with the FTIR spectrometer. FIG. 16 shows the growth, trapping and loss of particles from the plasma as a function of time as monitored by the solid-state $SiO_2$ peak as shown in FIG. 14. The plot is divided into three sections representing particle nucleation, trapping and expulsion from plasma stages of the experiment. During particle nucleation the $SiO_2$ peak increases sharply and reaches a maximum two minutes after the precursor flows are directed into the reactor. The TEOS signal increase less rapidly during particle nucleation as the TEOS is being consumed in particle formation and growth reactions. After 2 minutes the first particles grow large enough to leave the plasma glow and an equilibrium is reached between particle formation/growth and particles dropping out of the infrared beam and onto the substrate. At four minutes the precursors flows are switched off and only argon is dosed into the discharge. A drop in the $SiO_2$ absorption peak at this point indicates loss of some particles from the plasma sheath. On switching the precursors flows off, the plasma conditions change from that of an electro-negative discharge caused by the $O_2$ with low $n_e$ caused by the TEOS to an electro positive with higher $n_e$. This particle loss is attributed to a change in the plasma conditions as argon gradually replaces the precursor gases (possibly a result of higher ion drag).

A bulk of the particles remains trapped above the powered electrode until the r.f. field is switched off after nine minutes. At this point all remaining particles drop out of the infrared beam and onto the electrode. The residual $SiO_2$ signal observed between nine and eleven minutes is due to deposition of material on the KBr windows inside the reactor.

Infrared Analysis of Particles

A molecule can absorb radiation if the energy of the photon matches the transition between energy states in the molecule. For vibrational energy transitions, the energy difference corresponds to wavelengths in the infrared region of the electromagnetic spectrum. The selection rules for the transition state that there must be a change in the molecules dipole moment during the transition. Therefore, almost all except homonuclear diatomic molecules absorb infrared radiation, making IR spectroscopy ideal for identifying chemical systems. For a detailed description of infrared spectroscopic methods see Griffiths [*Chemical Infrared Fourier Transform Spectroscopy*, Griffiths P. R., Wiley & Sons, New York, (1975)] or Pelikan [*Applications of Numerical Methods in Molecular Spectroscopy*, Pelikan P., Ceppan M., Liska M., CRC Press, London, (1993)]. The application of the FTIR absorption spectroscopy technique for monitoring particles trapped in a plasma sheath is presented here.

Infrared spectroscopy can be used to quantify constituent concentrations in a sample by application of the Beer-Lambert law (Eq 20) in which the absorbance A of a species is related to the ratio of the intensity of the incident ($I_0$) and transmitted (I) light, sample path length (l) and concentration (c), $$A(v) = -\log\frac{I(v)}{I_0(v)} = \alpha(v)lc \qquad (20)$$

where $\alpha$ is the coefficient of absorption. If scattering can be neglected then, the absorption of infrared radiation by $SiO_2$ particles can be used to determine particle number density. The shape and intensity of Si—O absorption features centred at 1066 cm$^{-1}$ differs depending on whether the sample consists of a single bulk of $SiO_2$ or as fine powder dispersion. Using bulk values for the optical constants n and k, the extinction of the IR beam due to absorption can be calculated assuming spherical particles using Eq. (21), $$A(v) = -\frac{I(v)}{I_0(v)} = e^{-4\pi k \bar{v} d} \qquad (21)$$

where v is the wavenumber (cm$^{-1}$), k the extinction coefficient of bulk $SiO_2$ and d is a parameter relating to the effective combined thickness of material (particles) traversed by the light beam. In this particular case where we consider a cloud of particles suspended in the plasma, the "material" is represented by the thin cloud of particles, with number density $n_P$. The parameter d can be related to the particle radius a and number density by the following derivation. The volume of the cloud of particles within the infrared beam is given by, $$V_{cloud} = \pi r_b^2 d \qquad (22)$$

where $r_b$ is the and diameter of the infrared beam in the plasma. The $SiO_2$ particles are assumed to be spherical and hence $V_{particle}$ is given by, $$V_{Particles} = \frac{4}{3}\pi a_T^3 \quad (23)$$

where $\alpha_T$ is the particle radius (the reason for the subscript T will become evident later in FIG. C.1). The number density $n_P$ can now be calculated based on the volumes calculated above:

$$n_P = \frac{V_{cloud}}{V_{beam} \cdot V_{particle}} = \frac{3d}{4\pi l_b a_T^3} \quad (24)$$

where, $$V_{beam} = \pi r_b^2 l_b \quad (25)$$

and $l_b$ is the length of the infrared beam. Consequently, $n_P \cdot \alpha_T^3$ can be given as a function of the parameter d, which is a constant for one simulation:

$$n_P \cdot a_T^3 = \frac{3d}{4\pi l_b} \equiv C_1 \quad (26)$$

where $C_1$ is a constant. d is determined from fitted simulated spectra using $SiO_2$ bulk values for n and k (Eq. 21).

In addition to absorption, if the particles trapped in the infrared beam are large enough ($2\pi\alpha_T \gg \lambda$) they will also lead to Rayleigh and Mie scattering. This can be seen as a tilting of the baseline in the spectrum that becomes stronger at higher wavenumbers as both Rayleigh and Mie scattering are wavelength dependant. The extinction of light due to scattering can be calculated by defining the scattering cross section $C_{sca}$. From Eq. 21, $$A(v) = \frac{C_{sca} n_P l_b}{\ln 10} \quad (27)$$

where, $$C_{sca} = \frac{128}{3} \frac{\pi^5 a_T^6}{\lambda^4} \left| \frac{\tilde{n}^2 - 1}{\tilde{n}^2 + 2} \right| \quad (28)$$

where $\alpha_T$ is the particle radius, $\lambda$ the wavelength of incident light and $\tilde{n}$ the complex refractive index of the particle. This theory assumes particles are spherical and of sufficiently low number density that scattering is independent, i.e. distance between particles is larger then three times the particle radius. Equation (28) reflects the well known $\lambda^4$ dependence of Rayleigh scattering.

Figure 18:
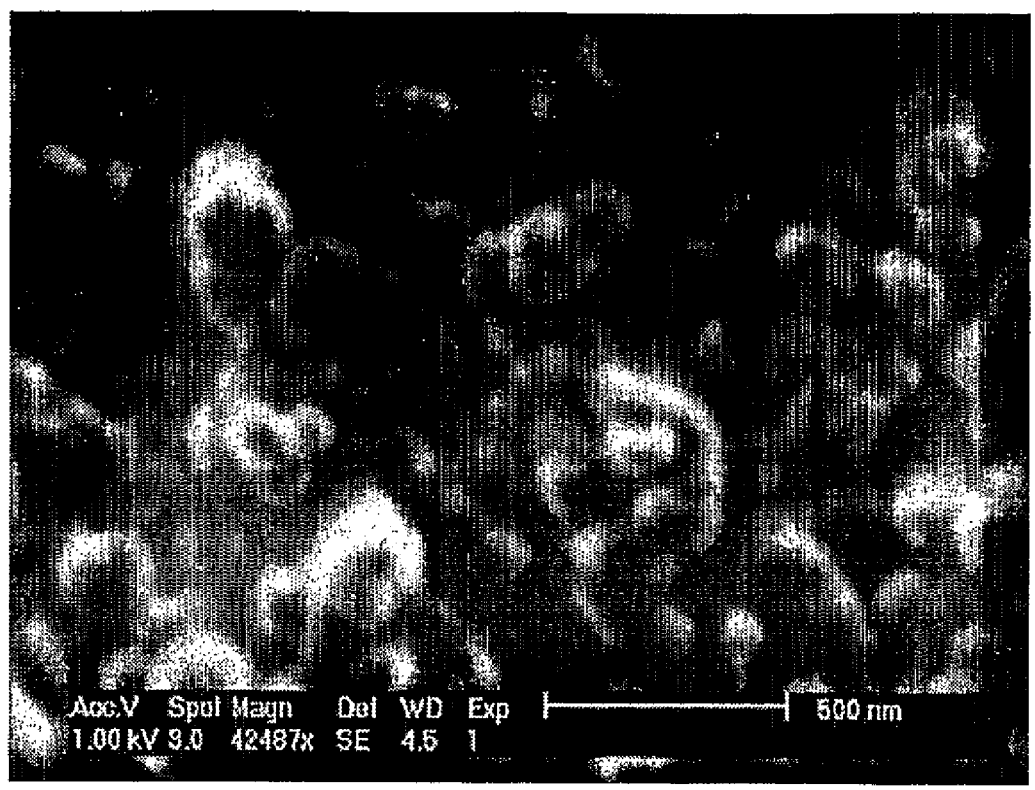
FIG. 18 shows the particle size distribution measured by ESEM image taken of particle clusters as described in Example 2.

At this point we have two expressions (24 and 27) and two unknowns ($\alpha_T$ and $n_p$). It is therefore possible to determine both the particle diameter and density provided we have both scattering and absorption data. Unfortunately no scattering was observed during the synthesis of pure $SiO_2$ particles. In order to solve for $n_P$, $\alpha_T$ was estimated from ESEM images taken of particles collected after the experiment (FIG. 18). Taking $\alpha_T$ to be between 100-150 nm, $n_P$ is calculated to be approximately $10^{14}$ m$^{-3}$.

Figure 19:
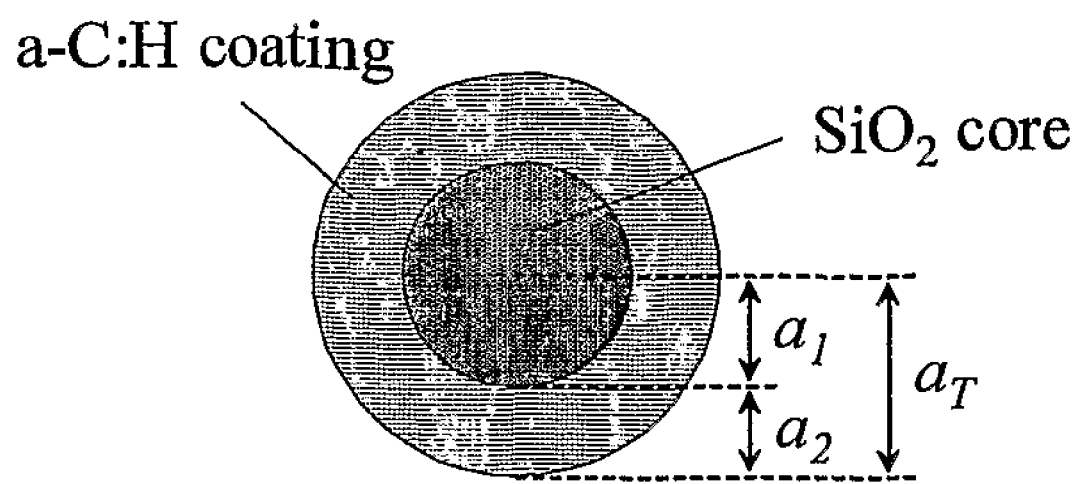
FIG. 19 shows the structure of a SiO2 particle coated with a-C:H layer as described in Example 2.

For cases where the particle is composed of more than one material (e.g. a coated particle), the expression (Eq. 27) is modified so that $\alpha_T$ becomes the total particle radius (FIG. 19).

$\tilde{n}$ is replaced with the effective refractive index approximation $\tilde{n}_{eff}$ as determined by Eq. (29), the so called Bruggeman effective medium approximation [Petrik P., Lehnert W., Schneider C., Lohner T., Fried M., Gyulai J., Ryssel H., Thin Solid Films, 383, 235-240. (2001)].

$$\tilde{n}_{eff}^2 = \frac{V_1}{V_{tot}} \tilde{n}_1^2 + \frac{V_2}{V_{tot}} \tilde{n}_2^2 \quad (29)$$

where $V_1$ and $V_2$ are the volumes of materials with refractive indices $\tilde{n}_1$ and $\tilde{n}_2$. The total extinction due to Rayleigh scattering is therefore, $$A(v) = \frac{128}{3} \frac{\pi^5 l_b}{\ln 10} \left| \frac{\tilde{n}_{eff}^2 - 1}{\tilde{n}_{eff}^2 + 2} \right| n_P a_T^6 v^4 = C_2 v^4, \quad (30)$$

where $C_2$ is a constant and $\alpha_T = \alpha_1 + \alpha_2$. Because $C_2$ can be determined by simulating the baseline tilt, $n_P \cdot \alpha_T^6$ can be determined from this:

$$n_P \cdot a_2^6 = \frac{C_2}{\frac{128}{3} \frac{l_b}{\ln 10} \pi^5 \left| \frac{\tilde{n}_{eff}^2 - 1}{\tilde{n}_{eff}^2 + 2} \right|} = C_3, \quad (31)$$

where $C_3$ is a constant.

The two equations derived (Eqs. 28 and 31) contain three unknown parameters $\alpha_1$, $\alpha_2$ and n. However, with these equations, $\alpha_2$ can be determined as a function of $\alpha_1$:

$$a_2 = \left( \frac{C_3}{C_1} \right)^{1/6} a_1^{1/2}. \quad (32)$$

and $\alpha_2$ is determined as a function of $\alpha_1$.

$SiO_2$ particle coated with a-C:H did cause significant scattering and absorption of the infrared radiation, but it is still not possible to solve due to the addition of a new variable $\alpha_2$. Assuming $\alpha_1$ and $n_P$ from the pure $SiO_2$ case we can estimate $\alpha_2$ to be between 100-120 nm, giving a total particle diameter, $\alpha_T$, of to be between 200-270 nm.

Rayleigh Scattering

The particle number density for a typical plasma experiment, as shown in FIG. 16, can be estimated from the absorption data. ESEM images of particles collected after an experiment indicate a particle radius of approximately 100 nm. Combining this estimation of the particle size with the $SiO_2$ absorption peak centred at 1066 cm$^{-1}$ provides an estimation of the particle density $n_p$ of approximately $10^{14}$ m$^{-3}$. This explains why no scattering signal is observed for the particles synthesized in the pure $TEOS/O_2$ plasma.

Physical Characterisation of Particles

Figure 17:
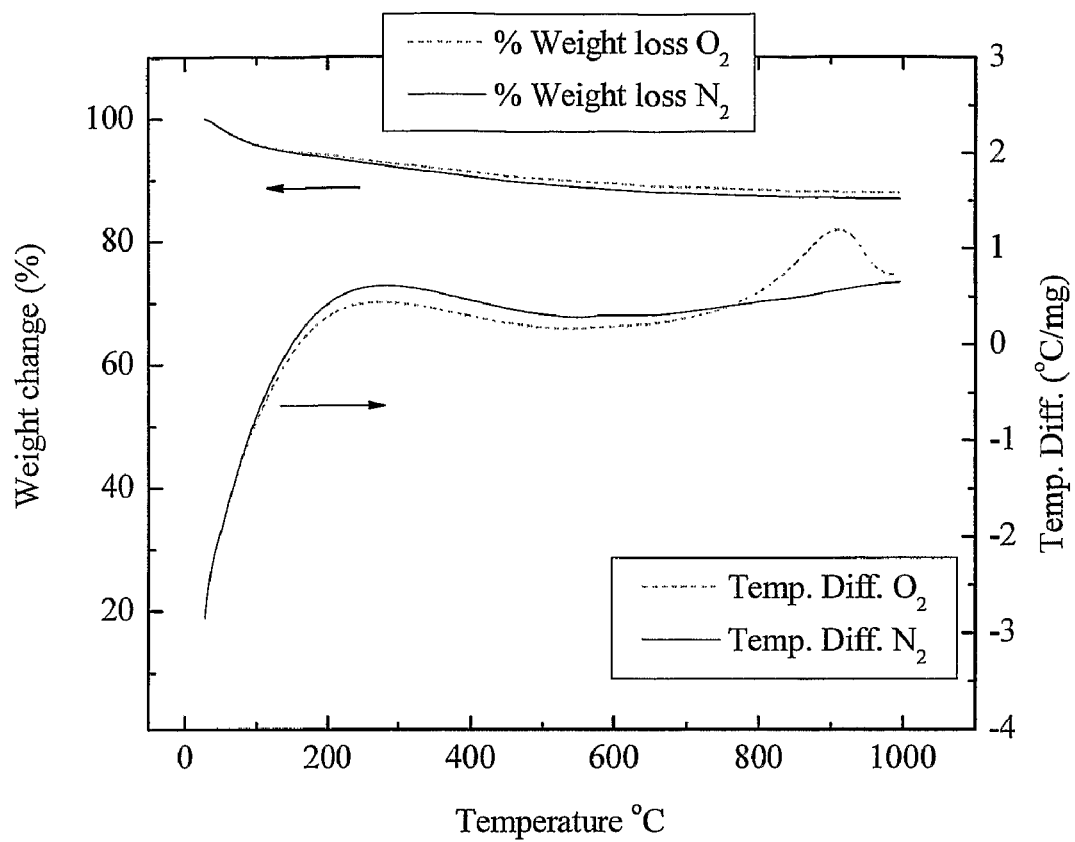
FIG. 17 shows the results of a Thermal Gravimetric Analysis (TGA) performed in pure N2 and air of powder collected from Zone I after nanocomposite layer synthesis in the experiment described in Example 2. The initial positive slope may indicate hydroxyl loss.

Thermal gravimetric analysis (TGA) is a used to provide information on the thermal stability and structure of the material. The measurement is performed by heating a sample of known mass under a controlled atmosphere in an oven. The thermal stability is determined by monitoring variations in the sample mass under either inert (Ar or $N_2$) or oxidizing ($O_2$ or $O_2/N_2$) atmospheres. In addition to monitoring variation in sample mass, monitoring the energy absorbed by the sample at different temperatures can also indicate variation in the material structure. Results from TGA can help predict how a material will react during post deposition plasma or thermal processing as is typically encountered when integrating a new material into semiconductor process. TGA was performed on particles collected after film deposition in both pure $N_2$ and 20% $O_2$ in $N_2$ atmospheres, using a temperature ramp rate set to 5° C./minute (see FIG. 17). Both measurements indicate the particles to be thermally stable up until temperatures in excess of 800° C. A 14% weight loss was observed for both measurements indicating no further oxidation of the particles took place in the oxidising atmosphere. The sample showed no signs of blackening or decomposition after TGA measurements, again indicating that the plasma produced particles are very stable.

DISCUSSION AND CONCLUSIONS

The synthesis, trapping of particles from a TEOS/$O_2$ gas mixture was successfully demonstrated using a capacitively coupled discharge. The high thermal stability suggested by TGA, coupled with the dominance of Si—O groups in the infrared suggests the particles are silica-like. However, it is likely that the particles are highly porous. Porosity is known to exist in plasma deposited films deposited from siloxane precursors such as TEOS and HMDSO and high bias potential are used to increase film density. The particles however, are formed from negative ions trapped in the plasma glow and the sheath surrounding them, and hence the energy of ions impinging on them is much lower than in the sheath region above the electrode (cf. section *Forces on Particles*). As the formation of dense fully oxidized $SiO_2$ networks requires high energy input, the energy is not available to form dense particles. In addition to this, particles collected post-deposition coagulate into extremely light structures that are easily affected by electrostatic forces. Small angle x-ray diffraction (SAXS) measurements also show no long range order within the particle structure. All these observations suggest the particles consist of an extremely porous $SiO_2$ network.

Particle number density and size could be estimated from in situ absorption FTIR measurements. The formation of particle heaps, and mushroom structures in the centre of the powered electrode was discussed in the context of OML theory combined with a fluid dynamic model of the reactor geometry used.

The incorporation of porous particles into silicone layers, and in particular the controlled incorporation of porosity, is of interest to low dielectric constant materials. The reactor design as described in Example 1 is very suitable for the deposition of nano-porous layers for low dielectric constant applications.

REFERENCES

[1] Jeng S P, Havemann R H, Chang M C. 1994. Mat. Res. Soc. Symp. Proc. 35:337.
[2] Ryan J G, Gefflcen R M, Poulin N R, Paraszczak J R. 1995. IBM J. Res. Dev., 39:371.
[3] http://Public.itrs.net
[4] Maex K, Baklanov M R, Shamiryan D, Iacopi F, Brongersma S H, Yanovitskaya Z S. 2003. J. Appl. Phys., 93(11): 8793-841.
[5] Grill A, Meyerson B S, Patel V V. 1990. IBM J. Res. Dev. 34(6): 849-57.
[6] Grill A. 2001. Thin Solid Films 398-339:527-532.
[7] Grill A. 2001. Diamond and Related Materials, 10:234-9.
[8] Liu P T, Chang TC, Sze S M, Pan F M, Mei Y J, Wu W F, Tsai M S, Dai B T, Chang C Y, Shih F Y, Huang H D. 1998. Thin Solid Films 332:345-50.
[9] Baklanov M R, Mogilnikov K P. 2002. Microelectr. Engin. 64:335-49.
[10] Xu J, Moxom J, Yang S, Suzuki R, Ohdaira T,. 2002. Appl. Surf. Sci. 194:189-94.
[11] Chang T C, Tsai T M, Liu P T, Mor Y. S, Chen C W, Mei Y J, Sheu J T, Tseng T Y. 2002. Thin Solid Films 420-421: 403-7.
[12] Uchida Y, Katoh T, Oikawa M. 2003. Mat. Sci. Semicond. Process. 5:259-64.
[13] Jain A, Rogojevic S, Ponoth S, Agarwal N, Matthew I, Gill W N, Persans P, Tomozawa M, Plawsky J L, Simonyi E. 2001. Thin Solid Films 398-399:513-522.
[14] Kim R-H, Park H-H, Hyun S-H, Yeom G-Y. 1998. Thin Solid Films 332:444-8.
[15] Liu P-T, Chang T C, Hsu K C, Tseng T Y, Chen L M, Wang C L, Sze S M. 2002. Thin Solid Films 414:1-6.
[16] Grill A, Patel V. 1999. J. Appl. Phys. 85(6):3314-8.
[17] Creatore M, Barrell Y, Kessels W M M, van de Sanden M C M. 2003. Mat. Res. Soc. Symp. Proc. 766, E6.9.1.
[18] Shaniryan D, Weidner K, Gray W D, Baklanov M R, Vanhaelemeersch S, Maex K. 2002. Microelectr. Engin. 64:361-6.
[19] Borvon G, Goullet A, Mellhaoui X, Charrouf N, Granier A. 2003. Mat. Sci. Semicond. Process. 5:279-4.
[20] Si J.-J., Show Y., Banerjee S., Ono H., Uchida K., Nozaki S., Morisaki H., Microelectr. Engin. 60, 313-321, (2002).
[21] Grill A, Patel V. 2001. J. Appl. Phys. 79(6), 803-805.
[22] Grill A. 2003. J. Appl. Phys. 93 (3):1785-90.
[23] Grill A, Patel V, Rodbell K P, Huang E, Baklanov M R, Mogilnikov K P, Toney M, Kim H-C. 2003. J. Appl. Phys. 94(5):3427-35.
[24] Grill A, Neumayer D A. 2003. J. Appl. Phys. 94(10): 6697-707.
[25] Jin C, Luttmer J D, Smith D M, Ramo T A. 1997. MRS Bull. 22(10):39.
[26] Mogsi K, Jacobs T, Brennan K, Rasco M, Wolf J, Augur R. 2002. Microelectr. Engin. 64:11-24.
[27] Volinsky A A, Vella J B, Gerberich W W. 2003. Thin Solid Films, 429:201-10.
[28] Travaly Y, Eyckens B, Carbonel L, Rothschild A, Le Q T, Brongersma S H, Ciofi I, Struyf H, Furukawa Y, Stucchi M, Schaekers M, Bender H, Rosseel E, Vanhaelemeersch S, Maex K, Gaillard F, Van Autryve L, Rabinzohn P. 2002. Microelectr. Engin. 64:67-374.
[29] Lanckmans F, Maex K. 2002. Microelectr. Engin. 60: 25-132.
[30] Lee H J, Oh K S, Choi C K. 2003. Surface and Coatings Technol. 171:296-301.
[31] Han S M, Aydil E S. 1996. Thin Solid Films, 290-291: 427-434.
[32] Lieberman M A, Lichtenberg A J. 1994. Principles of plasma discharges and materials processing, Wiley, ISDN 0-471-00577-0.
[33] Courteille C, Magni D, Howling A A, Nosenko V, Hollenstein C. 1997. Soc. Vac. Coat. 40th Annual Technical Conference Proc.

What is claimed is:

1. A device for applying a coating comprising nanoparticles incorporated in a polymer matrix to a substrate through plasma activated deposition of a chemical vapor phase, which device comprises a reactor space provided with a carrier for a substrate, and at least first and second capacitively coupled plasma sources, for activating, respectively, first and second precursors, respectively, in first and second plasmas, wherein said first and second plasma sources are separated by a separating mesh; wherein said first plasma source comprises a first zone of the device which first zone is delimited by a top plate and the separating mesh, wherein the first plasma source further comprises a first electrode, which is in the form of a wire mesh, and which first electrode is positioned in between the top plate and the separating mesh and said first plasma source comprises a precursor inlet for a first precursor for said nanoparticles;

wherein said second plasma source comprises a second zone of the device which zone is delimited by the separating mesh and a second electrode; and wherein said second plasma source comprises a precursor inlet for a second precursor for said polymer matrix;

wherein the first electrode is structured for discharging on both the separating mesh and the top plate; and wherein the plasma sources are situated in the processing direction, such that said nanoparticles when formed in said first plasma are transported from said first plasma through the separating mesh to said second plasma where they are combined with the matrix-forming chemistry produced in the second plasma before being deposited on the substrate.

2. A device according to claim 1, one of said precursor inlets being for an inorganic precursor and the other said inlet being for an organic precursor.

3. A device according to claim 1, wherein one of the plasma sources forms a direct plasma.

4. A device according to claim 1, wherein the plasma sources are pulsating.

5. A device according to claim 1, wherein said first precursor for said nanoparticles is a compound selected from the group of an organosilicon compound, silicon alkoxyde, siloxane, silane, silazane, silicon carboxylate, and silicon-β-diketonate.

6. A device according to claim 1, wherein said second precursor for said matrix is selected from the group of alkanes, alkynes, alkenes, arenes, and optionally wholly or partly (cyclo) alkyl-, aryl-, aralkyl-, allyl-, methoxy-, halogen-, hydroxy-, amino-, nitro-, and cyano-substituted derivatives thereof.

7. A device according to claim 1, wherein the electrode of said first plasma source is in the form of a wire mesh.

8. A device according to claim 1, wherein the second electrode is the carrier for a substrate.

9. A device according to claim 1, wherein the region of the first plasma source is delimited by a top plate and the separating mesh.

10. A device according to claim 9, wherein separating mesh is suspended from the top plate by way of a suspension device and is provided with a grounding, thereby also grounding the top plate.

11. The device according to claim 1, wherein the first electrode is provided with a radiofrequency charge.

12. The device according to claim 1, wherein the first electrode comprises a self-biasing radio frequency mesh.

13. The device according to claim 1, wherein the device is arranged for a) ionizing the precursor material for said nanoparticles in said first plasma into negative ions, b) trapping said negative ions in the electric field of said first plasma, and c) allowing condensation of additional activated precursor material on said trapped negative ions to thereby allow the formation of nanoparticles from said activated precursors in said first plasma, and wherein said first and second capacitively coupled plasma sources of said device are pulsating during operation.

\* \* \* \* \*

UNITED STATES PATENT AND TRADEMARK OFFICE
CERTIFICATE OF CORRECTION

PATENT NO. : 8,230,807 B2
APPLICATION NO. : 11/578491
DATED : July 31, 2012
INVENTOR(S) : Gregory Robert Alcott et al.

Page 1 of 1

It is certified that error appears in the above-identified patent and that said Letters Patent is hereby corrected as shown below:

In the Specification

Column 18, line 15, "Table 26." should read --Table 2.--;

Column 19, line 58, "($C_1$+ and" should read --($C_{p1}$+ and--;

Column 19, line 62, "($CT$)" should read --($C_T$)--;

Column 24, line 54, "($K_n=\lambda_{m/p}/\alpha$)" should read --($K_n=\lambda_{mfp}/\alpha$)--;

Column 26, line 22, "Fnd" should read --$F_{nd}$--; and

Column 28, line 51, Equation (21), reads as follows:

"$$A(v) = -\frac{I(v)}{I_0(v)} = e^{-4\pi k \bar{v} d}$$"

Equation (21) should read as follows:

$$A(v) = -log\frac{I(v)}{I_0(v)} = e^{-4\pi k \bar{v} d}$$
--.

Signed and Sealed this
Third Day of June, 2014

Michelle K. Lee
*Deputy Director of the United States Patent and Trademark Office*